United States Patent
Takano

(10) Patent No.: US 8,544,169 B2
(45) Date of Patent: Oct. 1, 2013

(54) METHOD OF MANUFACTURING A THROUGH-HOLE ELECTRODE SUBSTRATE

(75) Inventor: Takamasa Takano, Tokyo (JP)

(73) Assignee: Dai Nippon Printing Co., Ltd., Tokyo (JP)

(*) Notice: Subject to any disclaimer, the term of this patent is extended or adjusted under 35 U.S.C. 154(b) by 374 days.

(21) Appl. No.: 12/875,644

(22) Filed: Sep. 3, 2010

(65) Prior Publication Data

US 2011/0056740 A1    Mar. 10, 2011

(30) Foreign Application Priority Data

Sep. 9, 2009 (JP) ................................ 2009-208374
Aug. 4, 2010 (JP) ................................ 2010-175286

(51) Int. Cl.
*H01K 3/10* (2006.01)

(52) U.S. Cl.
USPC ................................ 29/852; 29/825; 29/829

(58) Field of Classification Search
USPC ................... 29/852, 825, 829, 874; 257/415, 257/704, 734, 774, E21.499, E21.597, E23.011, 257/E23.181, E29.324
See application file for complete search history.

(56) References Cited

U.S. PATENT DOCUMENTS 5,700,349 A * 12/1997 Tsukamoto et al. .......... 438/637

FOREIGN PATENT DOCUMENTS

| JP | 2000-252599 A | 9/2000 |
| JP | 2002-26520 A | 1/2002 |

* cited by examiner

*Primary Examiner* — Thiem Phan

(74) *Attorney, Agent, or Firm* — Pearne & Gordon LLP

(57) ABSTRACT

A method of manufacturing a through-hole electrode substrate includes forming a plurality of through-holes in a substrate, forming a plurality of through-hole electrodes by filling a conductive material into the plurality of through-holes, forming a first insulation layer on one surface of the substrate, forming a plurality of first openings which expose the plurality of through-hole electrodes corresponding to each of the plurality of through-hole electrodes, on the first insulation layer and correcting a position of the plurality of first openings using the relationship between a misalignment amount of a measured distance value of an open position of a leaning through-hole among the plurality of through-holes and of a design distance value of the open position of the leaning through-hole among the plurality of through-holes with respect to a center position of the substrate.

8 Claims, 25 Drawing Sheets

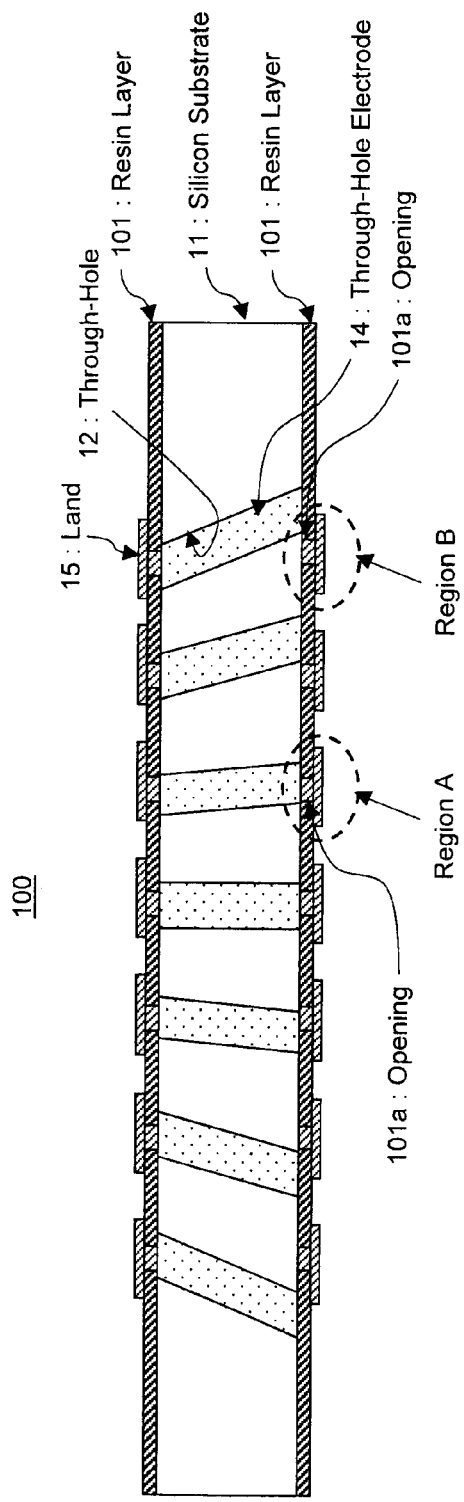
FIG. 7
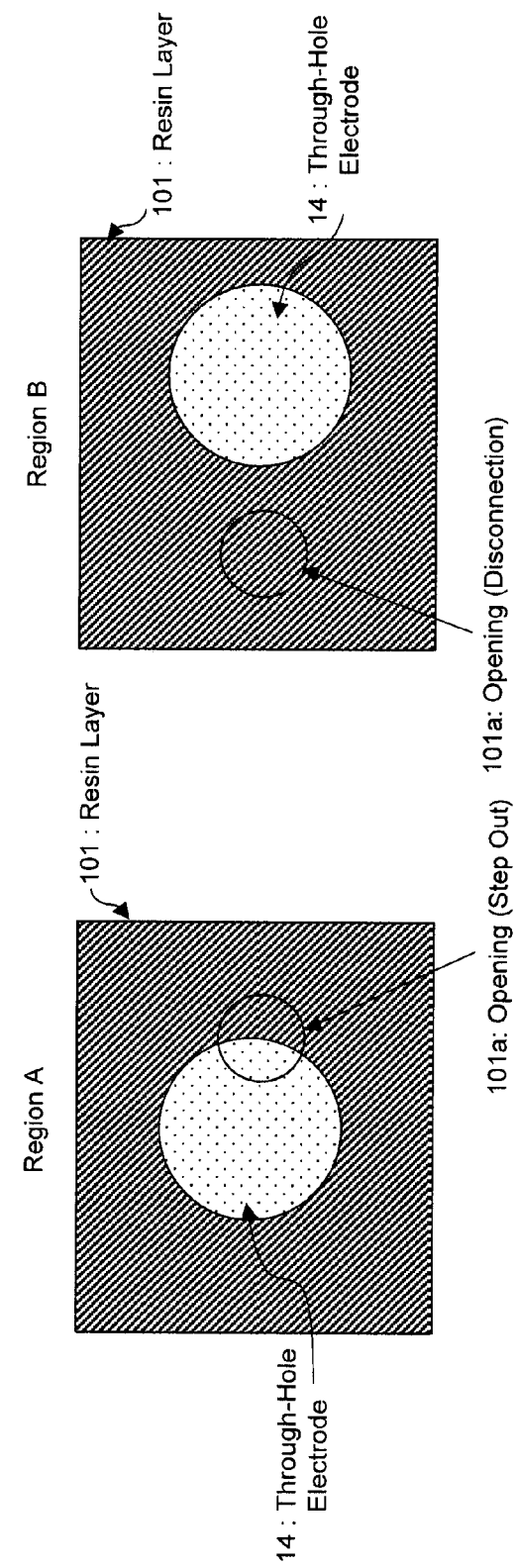
FIG. 8A
Region A
FIG. 8B
Region B

Mask A
Before Correction (Conventional)

Mask B
After Correction (Proposed)

200

201 : Resin Layer
15 : Land

200

202 : Seed Layer
15 : Land
201 : Resin Layer
12 : Through-Hole
11 : Silicon Substrate
14 : Through-Hole Electrode
202 : Seed Layer
15 : Land Mask A
Before Correction (Design Value)

Mask B
After Correction

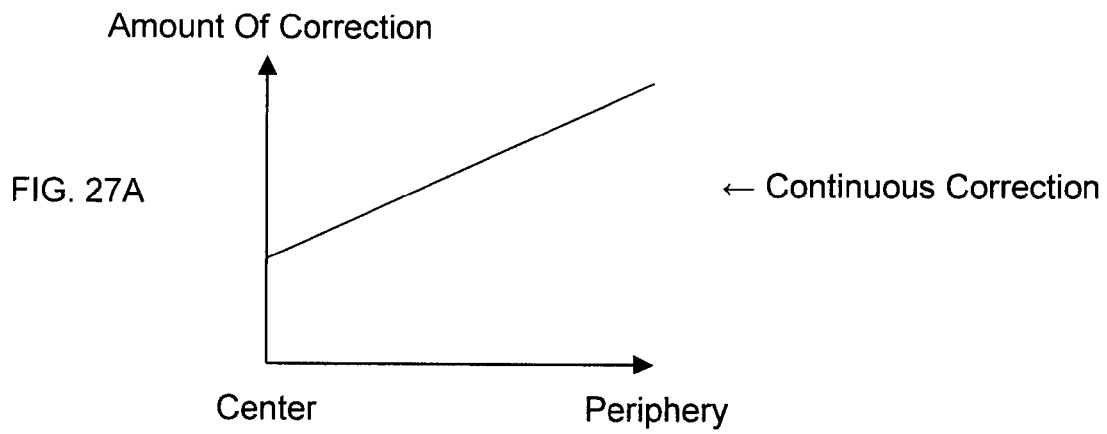
FIG. 27A ← Continuous Correction
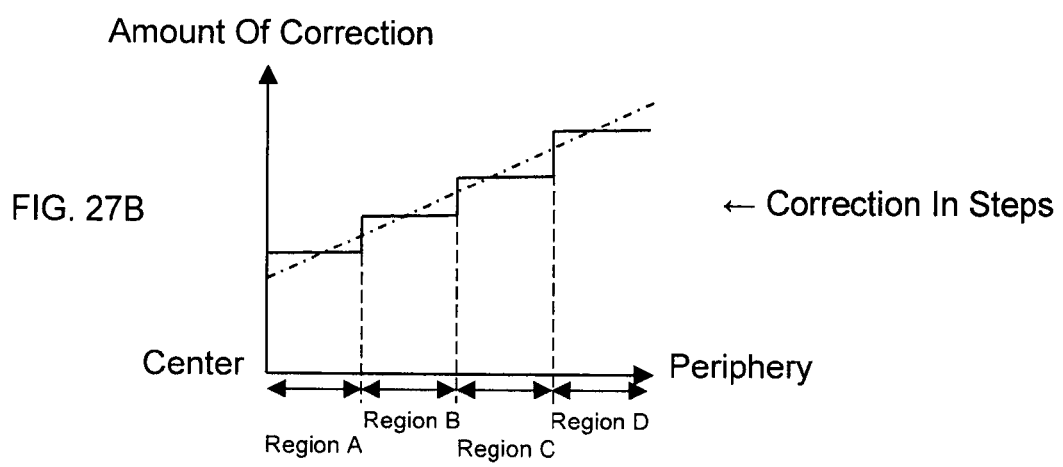
FIG. 27B ← Correction In Steps
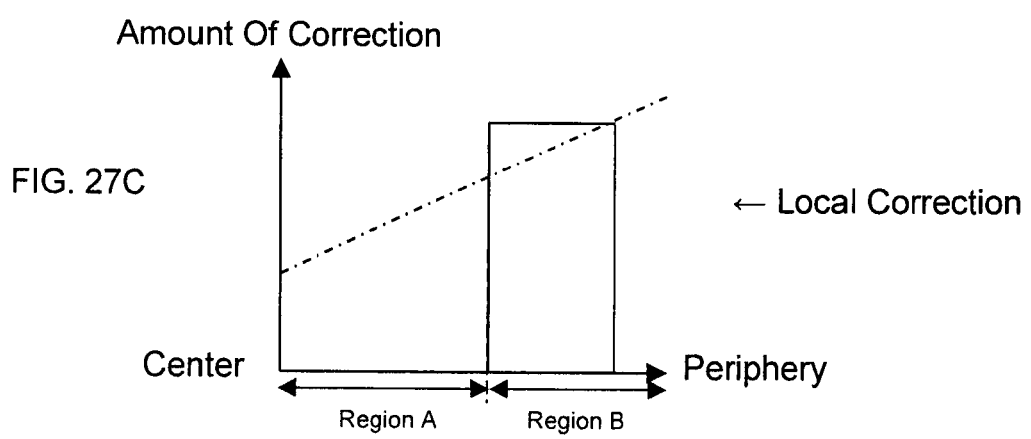
FIG. 27C ← Local Correction

US 8,544,169 B2

METHOD OF MANUFACTURING A THROUGH-HOLE ELECTRODE SUBSTRATE

CROSS REFERENCE TO RELATED APPLICATION

This application is based upon and claims the benefit of priority from the prior Japanese Patent Application No. 2009-208374, filed on 7 Sep. 2009, and No. 2010-175286, filed on 4 Aug. 2010, the entire contents of which are incorporated herein by reference.

The present invention is related to a through-hole electrode substrate arranged with a through-hole electrode which passes through the front and back surfaces of a semiconductor substrate, and is also related to a method of manufacturing the through-hole electrode substrate.

BACKGROUND OF THE INVENTION

1. Field of the Invention

With the progress in high integration and miniaturization of electronic devices in recent years, LSI chips are being reduced to the same size as a semiconductor package while the high integration of chips arranged in two dimensions within a package is reaching its limits. Therefore, it is necessary to divide the LSI chips and stack them in three dimensions in order to increase the mounting density of chips within a package. In addition, it is also necessary to reduce the distance between stacked circuits in order to operate the entire semiconductor package stacked with LSI chips at high speeds.

Thus, in response to the above stated demands, a through-hole electrode substrate arranged with a connection part which passes through the front and back surfaces of the substrate is proposed as an interposer between LSI chips. In this type of through-hole electrode substrate, the through-hole electrode is formed by filling a conductive material (Cu etc) into a through-hole using electrolytic plating.

An example of a through-hole electrode substrate 10 is shown in FIG. 22. The through-hole electrode substrate 10 is arranged with a silicon substrate 11, a through-hole 12 which passes through the substrate in the thickness direction of the silicon substrate 11, a through-hole electrode 14 comprised from copper (Cu), nickel (Ni), gold (Au), multi-layer plating (Cu/Ni/Au) etc formed within the through-hole 12, and a land 15 comprised of copper (Cu), gold (Au), multi-layer plating (Cu/Ni/Au) etc arranged on the upper and lower surfaces of the through-hole electrode 14. Furthermore, although not shown in FIG. 22 an insulation film comprised of silicon oxide $SiO_2$ etc is formed on the upper and lower surface from an inner wall of the through-hole 12.

The through-hole electrode substrate 10 shown in FIG. 22 is manufactured by the method described below. First, a hole which does not pass completely through the substrate is formed using a method such as RIE (Reactive Ion Etching), DeepRIE, light etching or wet etching on one surface of the silicon substrate 11. Next, the silicon substrate 11 is thinned by a method such as grinding etc from the other surface of the silicon substrate 11, that is, from the surface which is opposite to the surface in which the hole is formed, and the hole passes completely through the substrate. An insulation film (not shown in the diagram) is formed on the inner surface of this through-hole 12 and on both surfaces of the silicon substrate 11 using a method such as thermal oxidation or CVD (Chemical Vapor Deposition). Next, after burying a conductive material comprised of a metal material such as Cu etc which becomes the through-hole electrode 14 within the through-hole 12 which is formed with the insulation film, excess conductive material which sticks out from the through-hole 12 is removed using a method such as CMP (Chemical Mechanical Polishing). Following this, a land 15 is formed by patterning and which becomes the wiring and electrode pad made of copper (Cu) etc on the upper and lower surfaces of the silicon substrate 11.

However, in the through-hole electrode substrate 10 manufactured by the manufacturing method described above it is confirmed that a blow off phenomenon occurs in a wiring layer 15 or raised parts or cracks are produced within the through-hole 12 during an anneal process.

For example, Japanese Laid Open Patent 2002-26520 and Japanese Laid Open Patent 2000-252599 are proposed in order to reduce the blow off phenomenon which occurs in a wiring layer or raised parts or cracks produced in an insulation film during an anneal process of the manufacturing process of the above described through-hole electrode substrate. In a multi-layer wiring substrate described in Japanese Laid Open Patent 2002-26520, an opening is arranged so as to pass through the top and bottom of a via island arranged directly above a via hole conductor filled with a conduction paste and an expansion of a gas component or water component included within the conduction paste is suppressed during thermal process. In the print substrate described in Japanese Laid Open Patent 2000-252599, a hole is arranged which is connected with the external atmosphere and the conductive film which covers the surface of a sealing component of a resin which is filled into a through-hole, and the gas which is discharged from the a sealing component is released to the external atmosphere by adding heat during reflow.

2. Description of the Related Art

However, the multi-layer wiring substrate and the print substrate proposed in the Japanese Laid Open Patent 2002-26520 and Japanese Laid Open Patent 2000-252599 described above deal with defects produced by gas discharged from a through hold electrode filled in which the through-hole is filled with a conductive paste or resin, but do not deal with defects produced by gas discharged from a through-hole electrode in which a through-hole formed with an insulation film is filled with a metal material as stated above.

A metal material such as copper (Cu) etc which is filled into the through-hole 12 as the through-hole electrode 14 stretches, gas (water component ($H_2O$) or hydrogen ($H_2$) etc) which still remains in the metal material is discharged during the anneal process, land 15 is raised up and the occurrence of the blow off phenomenon was confirmed. In addition, in the anneal process, when the heating temperature is raised above, for example, 400° C., raised parts and cracks are produced in an insulation film due to the difference in a thermal expansion coefficient between a metal material such as Cu etc which is filled as the through-hole electrode 14 and an insulation material such as $SiO_2$ etc used as the insulation film, and if a metal material enters into the cracks there is a possibility that shorts will occur between through-hole electrodes. The through-hole electrode substrate 10 shows that it is necessary to set the heating temperature during the anneal process low in order to prevent this phenomenon. However, the anneal process is necessary and measures are required because the discharge of gas from the above described through-hole electrode 14 occurs even in the case where a heating temperature does not cause cracks.

In addition, in the manufacturing process of the through-hole electrode substrate, tilt is produced in a part of the through-hole, a misalignment is produced between the position of an opening formed in an insulation film which is formed on the upper and lower surfaces of a the silicon substrate and the formation position of the through-hole, and defects such as [step out] or [disconnection] of the rand described above are produced by the amount of misalignment of the opening with respect to the lower surface of the through-hole in which tilt is produced. Measures are necessary for dealing with defects that are produced by tilt of this through-hole.

BRIEF SUMMARY OF THE INVENTION

A through-hole electrode substrate related to one embodiment of the present invention includes a substrate including a plurality of through-holes, a plurality of through-hole electrodes arranged within each of the plurality of through-holes, and a first insulation layer arranged on one surface of the substrate, wherein the first insulation layer includes a plurality of first openings which expose each of the plurality of through-hole electrodes, the plurality of through-holes includes a leaning through-hole leaning from one surface to the other surface of the substrate, and each of the plurality of first openings is arranged to match an open position of the leaning through-hole.

A method of manufacturing a through-hole electrode substrate related to one embodiment of the present invention includes forming a plurality of through-holes in a substrate, forming a plurality of through-hole electrodes by filling a conductive material into the plurality of through-holes, forming a first insulation layer on one surface of the substrate, forming a plurality of first openings which expose the plurality of through-hole electrodes corresponding to each of the plurality of through-hole electrodes, on the first insulation layer, and correcting a position of the plurality of first openings using the relationship between a misalignment amount of an open position of a leaning through-hole among the plurality of through-holes and a center position of the substrate.

BRIEF DESCRIPTION OF THE DRAWINGS

FIG. 7 is a cross sectional diagram of the through-hole electrode substrate formed with a resin layer related to the first embodiment;

FIG. 8A is a diagram which shows a [step out] of an opening in the region A shown in FIG. 7;

FIG. 8B is a diagram which shows a [disconnection] of an opening in the region B shown in FIG. 7;

FIG. 27A is a graph which exemplifies a linear function as the correction function related to a fifth embodiment;

FIG. 27B is a graph which exemplifies a function which sets the amount of correction in steps as the correction function related to a fifth embodiment;

FIG. 27C is a graph which exemplifies a function which sets the amount of correction locally as the correction function related to a fifth embodiment;

Figure 1:
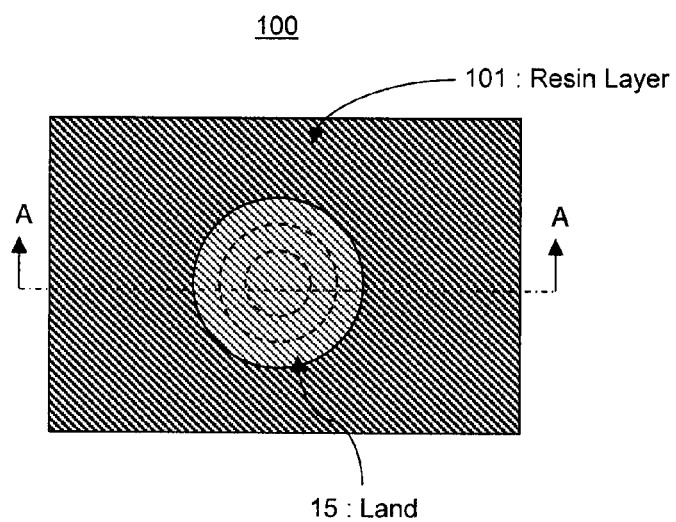
FIG. 1 is a planar view diagram which shows a structure of a through-hole electrode substrate related to a first embodiment of the present invention.

DETAILED DESCRIPTION OF THE INVENTION (First Embodiment)

The first embodiment of the present invention will be explained while referring to the drawings.
(Structure of the Through-Hole Electrode Substrate)

Figure 2:
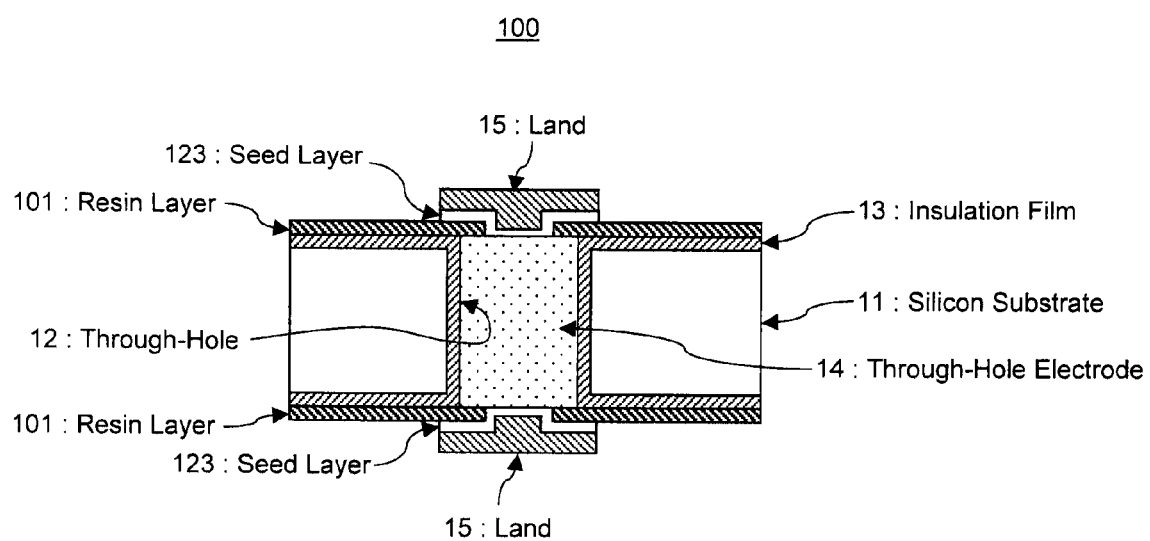
FIG. 2 is a cross sectional diagram which shows a structure of the through-hole electrode substrate in FIG. 1 see from the line A-A.
Figure 22:
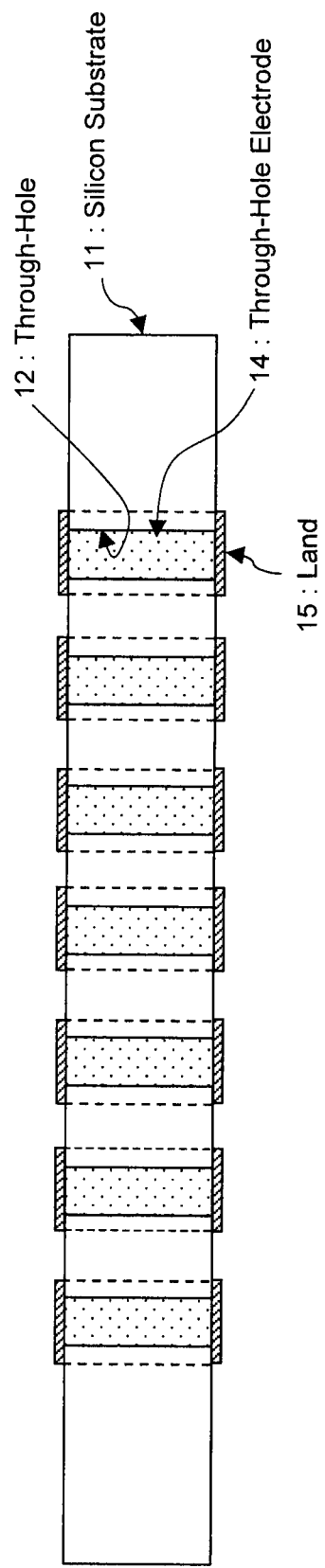
FIG. 22 is a cross sectional diagram which shows an example of a conventional through-hole electrode substrate.

The structure of the through-hole electrode substrate 100 related to the first embodiment will be explained while referring to FIG. 1 and FIG. 2. FIG. 1 is a planar view diagram of the through-hole electrode substrate 100 see form the upper surface. FIG. 2 is a cross sectional diagram see from the line A-A in FIG. 1. In FIG. 1 and FIG. 2, the same structural components as in the through-hole electrode substrate 10 in FIG. 22 are attached with the same reference symbols. In the through-hole electrode substrate 100 shown in FIG. 1 and FIG. 2, a resin layer 101 and a land 15 are formed on the upper and lower surfaces of a silicon substrate 11 (base material) which is formed with an insulation film 13 and a through-hole electrode 14. The resin layer 101 may be formed using an inorganic insulation film such as a silicon oxide film or a silicon nitride film. In addition, the resin layer 101 is preferred to be an insulation film having a gas discharge function using a resin material such as polyimide. In this case, the resin layer 101 is arranged for discharging gas which is discharged from within the through-hole electrode 14 to the exterior. That is, in the first embodiment, the resin layer 101 may be arranged as a gas discharge part. Furthermore, the resin layer 101 causes peeling (raised parts) of a pad in the land 15 together with stretching of a metal material such as copper (Cu) etc which is filled as the through-hole electrode 14 in an anneal process but is also arranged to demonstrate damper effects by functioning as a buffer layer for relieving stretching of the metal material. Furthermore, the thickness of the silicon substrate 11 is not particularly limited and can be appropriately set according to purpose.

(Manufacturing Method of the Through-Hole Electrode Substrate)

Next, a process for manufacturing the through-hole electrode substrate 100 is explained while referring to FIG. 3 and FIG. 4. FIG. 3A to FIG. 3E are diagrams which shows the sequence of processes for forming a through-hole electrode on the silicon substrate 11. Furthermore, in FIG. 3A to FIG. 3E, only one though hole electrode 14 is shown formed on the silicon substrate 11 in order to simplify the explanation. In an actual silicon substrate 11, a plurality of through-hole electrodes having a desired hole diameter (for example, 10 [μm] to 100 [μm]) are formed at desired intervals depending on the specifications.

Figure 3A:
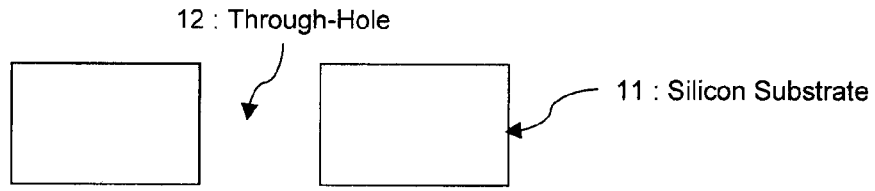
FIG. 3A is a diagram which shows a process for forming a through-hole.

(1) Forming a Through-Hole First, in FIG. 3A, a hole (not shown in the diagram) which does not pass completely through the substrate is formed on one surface of the silicon substrate 11 using a method such as RIE, DeepRIE, light etching or wet etching. Next, the silicon substrate 11 is thinned by a method such as grinding from the other surface of the silicon substrate 11, that is, the surface opposite to the surface on which the hole is formed and the hole passes completely through the substrate forming the through-hole 12.

(2) Forming an Insulation Film

Figure 3B:
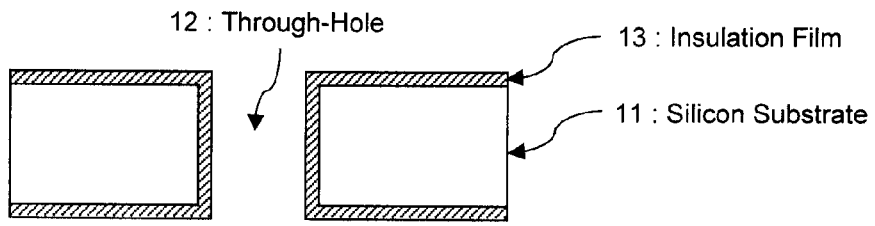
FIG. 3B is a diagram which shows a process for forming an insulation film.

Next, in FIG. 3B, an insulation film 13 is formed on the upper surface and lower surface of the silicon substrate 11 and the interior wall of the though hole 12. The insulation film 13 is comprised for example from silicon oxide ($SiO_2$), silicon nitride (SiN) or silicon carbon (SiC). This insulation film 13 is formed using an LPCVD method, plasma CVD method or sputter method. In the case the insulation film 13 is formed from silicon oxide ($SiO_2$), it is also possible to form using a thermal oxidation method or anode oxidation method. The insulation film 13 may be formed as a single layer or as a multi-layer structure having two or more layers.

(3) Forming a Seed Layer

Figure 3C:
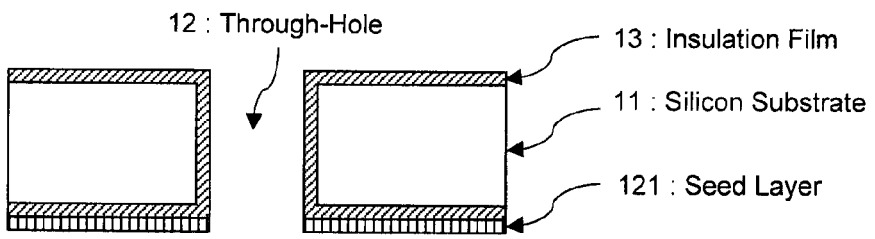
FIG. 3C is a diagram which shows a process for forming a seed layer.

Next, in FIG. 3C, a seed layer 121 is formed on the lower surface side of the silicon substrate 11 formed with the insulation film 13 using a method such as a sputtering method. Furthermore, the seed layer 121 may be formed in one layer using a material such as titanium (Ti) or may be formed in two layers using titanium (Ti) and copper (Cu). In the case where the seed layer 121 is formed in two layers, it is preferred that the copper (Cu) layer be formed as a layer which contacts with the through-hole electrode 14 described below.

(4) Forming a Conducting Part

Figure 3D:
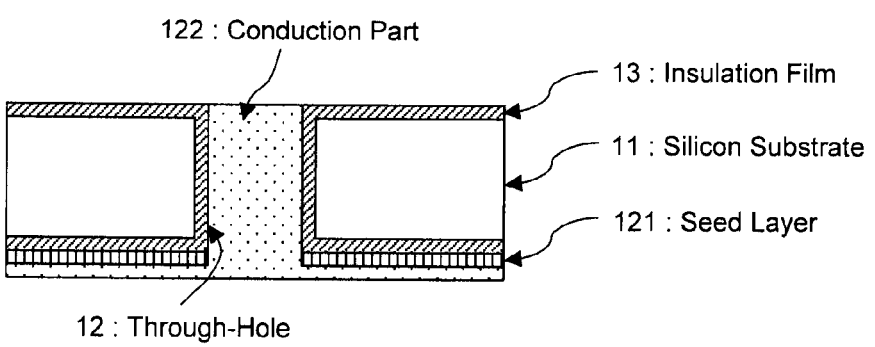
FIG. 3D is a diagram which shows a process for forming a conduction part.

Next, in FIG. 3D, the seed layer 121 of the silicon substrate 11 is made into a power supply layer by electrolytic plating and a conducting part 22 is formed by filling a conducting material (copper (Cu), or copper alloy etc) into the through-hole 12. In this case, the conducting part 122 is also formed on the surface on which the seed layer 121 is formed as is shown in FIG. 3D. It is possible to use a sputtering method, a non-electrolytic plating method, a molten metal aspiration method, a printing method or CVD method for filling the copper (Cu) or copper alloy.

Figure 3E:
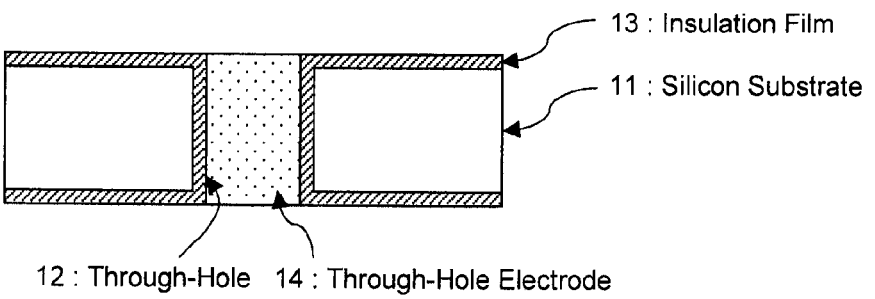
FIG. 3E is a cross sectional diagram which shows a completed through-hole electrode substrate.

(5) Forming a Through-Hole Electrode Next, in FIG. 3E, the surface on which the seed layer 121 and the conduction part 122 of the silicon substrate 11 is formed is etched using a method such as CMP, the conduction part 122 and the seed layer 121 are removed and the formation of the through-hole electrode 14 is complete.

(6) Forming a Resin Layer

Figure 4A:
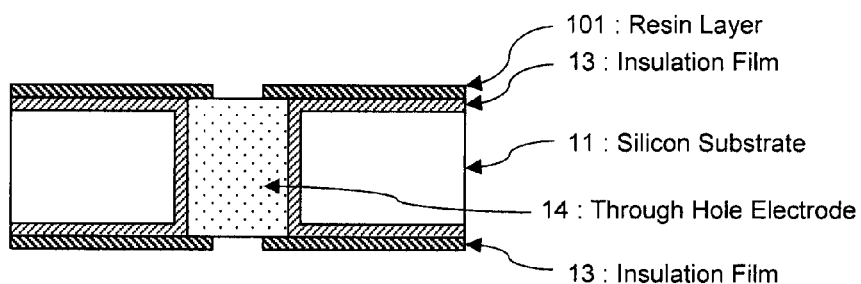
FIG. 4A is a diagram which shows a process for forming a resin layer.

Next, in FIG. 4A, on the upper and lower surfaces of the silicon substrate 11 formed with the through-hole electrode 14, an insulation resin such as photosensitive polyimide is patterned on the periphery of the through-hole electrode 14 as is shown in FIG. 1 and FIG. 2 using photolithography, annealing (200° C. to 400° C.) and a resin layer 101 is formed. In this case, it is important that the resin layer 101 is formed so as to cover one part of a boundary section between a formation part of the insulation film 13 and a formation part of the through-hole electrode 14. That is, in the annealing process described above, it is clear that the gas which is discharged from the interior of the through-hole electrode 14 is discharged from a slight gap formed on the boundary part between the insulation film 13 and the through-hole electrode 14 after removing a plating resist 124 described later by a chemical process using an organic solvent. This will be described further below. Furthermore, the resin layer 101 may be formed using an inorganic material ($SiO_2$, SiN etc) or an organic material with an organic material being preferred. As an organic material, for example, a material including one or two or more of materials selected from the following can be used as the resin layer 101: epoxy resin, polyimide resin, benzocyclobutane resin, polyamide resin, phenol resin, silicon resin, fluorine resin, crystalline polymer, polyamide-imide, polybenzooxazole, cyanate resin, aramid, polyolefin, polyester, BT resin, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyetherimide. In addition, an inorganic filler such as glass, talc, mica, silica or alumina may be used in combination in the resin layer 101. As long as the resin layer 101 includes a material which has a gas discharge function and a buffer layer function any material may be used.

(7) Forming a Plating Resist

Figure 4B:
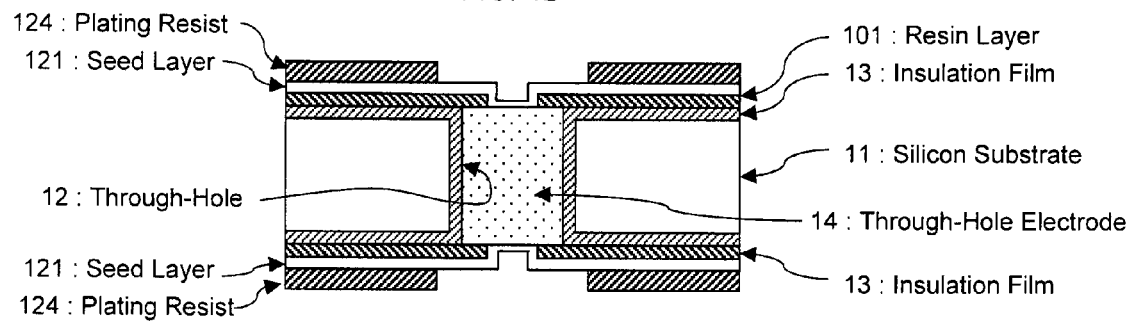
FIG. 4B is a diagram which shows a process for forming a seed layer and a plate resist.

Next, in FIG. 4B, a seed layer 123 is formed on the surface which is formed with the resin layer 101 using a sputtering method. A plating resist is formed on the seed layer 123 using photolithography. Furthermore, the seed layer 123 may be formed as one layer using titanium Ti as a seed material or as two layers using titanium (Ti) and CU (copper).

(8) Forming a Land

Figure 4C:
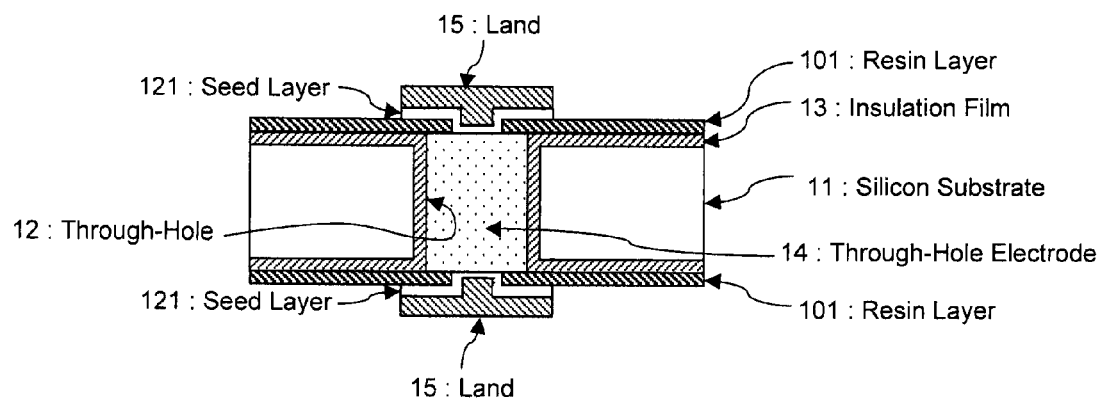
FIG. 4C is a cross sectional diagram which shows a completed through-hole electrode substrate.

Next, in FIG. 4C, a land 15 which becomes wiring and an electrode pad is formed by making the seed layer 123 as a power supply layer by electrolytic plating. The land 15 may be formed using copper (Cu), gold (Au), multi-layer plating (Cu/Ni/Au) or a copper alloy as a material. Next, on the surface on which the land 15 of the silicon substrate 11 is formed, the plating resist 124 is removed by a chemical process, the seed layer 123 is removed by a chemical etching process and formation of the through-hole electrode substrate 100 is complete.

In FIG. 3 and FIG. 4, the case where the resin layer 101 and the land 15 are formed on the upper and lower surfaces of the silicon substrate 11 is shown. However, the resin layer 101 and the land 15 may be similarly formed on only the upper surface or only the lower surface of the silicon substrate 11 by the above described process.

(Tilt and Gas Discharge of the Through-Hole Electrode During Etching)

Figure 5:
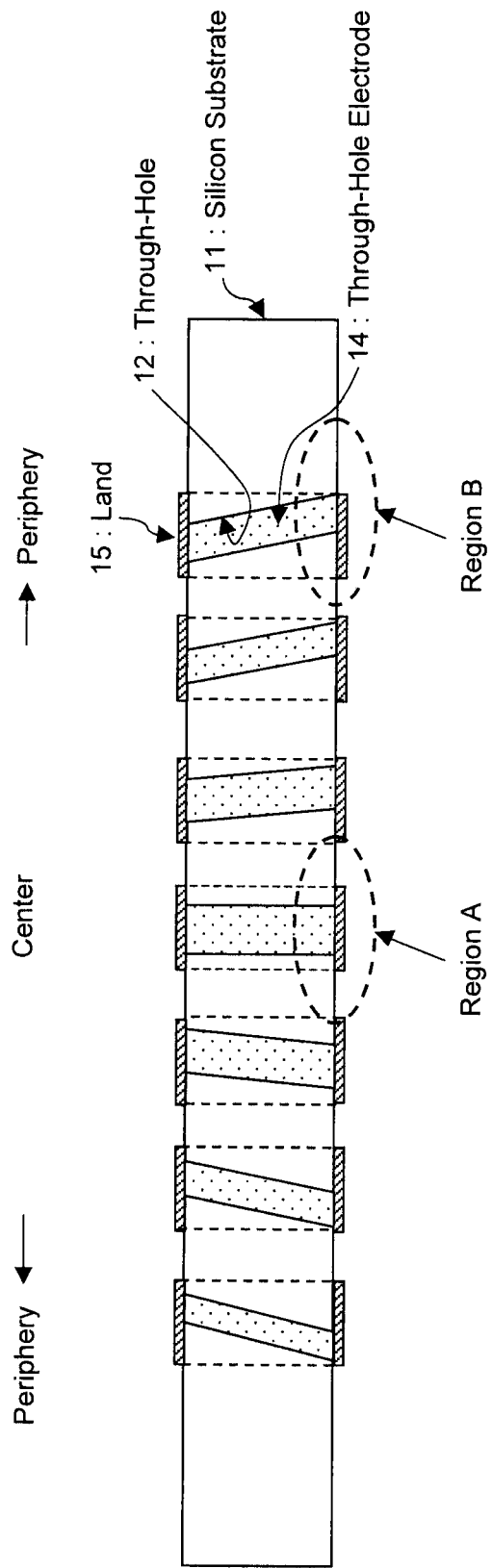
FIG. 5 is a diagram which shows a cross section a through-hole electrode substrate with a titled through-hole.
Figure 6A:
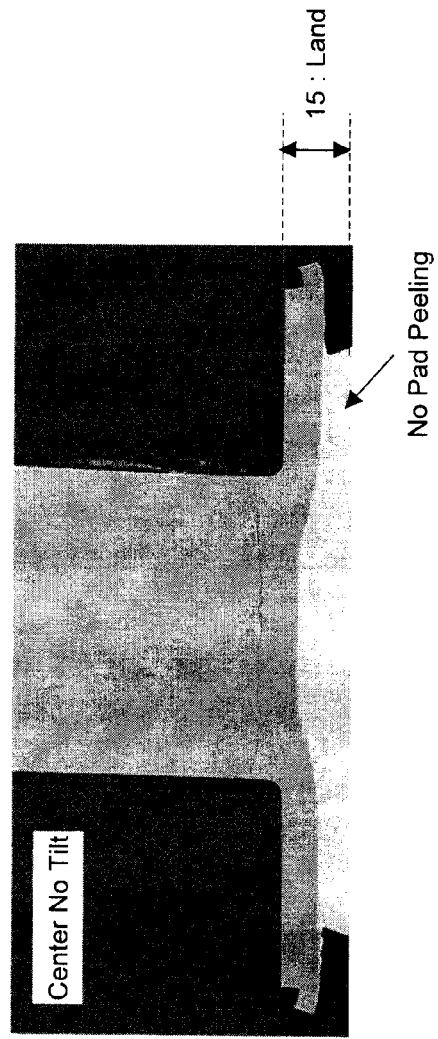
FIG. 6A is a SEM photograph of the region A shown in FIG. 5.
Figure 6B:
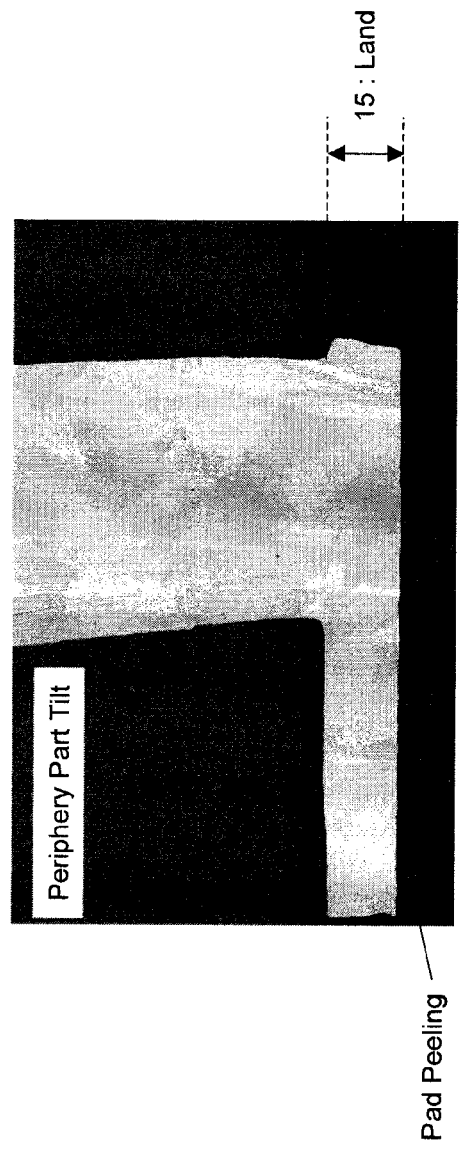
FIG. 6 (B) is a SEM photograph of the region B shown in FIG. 5.

In the through-hole electrode substrate 100 formed by the manufacturing method described above, in the case where the through-hole 12 is formed using dry etching, it was confirmed that a tilt occurs in which the through-hole 12 is formed gradually leaning towards the upper surface of the silicon substrate 11 from the center part of the silicon substrate 11 heading towards the exterior periphery as is shown in FIG. 5. In FIG. 5, Each SEM photograph of a region A shown in the center part of the silicon substrate 11 and a region B shown in the exterior periphery of the silicon substrate 11 are shown in FIG. 6A and FIG. 6B. Because a tilt does not occur in the region A shown in FIG. 6A the positional relationship between the through-hole 12 and the rand 15 is normal, and pad peeling (raised parts) etch does not occur on the land 15. In addition, because a tilt occurs in the through-hole 12 in region B shown in FIG. 6B, a misalignment occurs in the positional relationship between the through-hole 12 and the land 15, and pad peeling occurs in the land 15. Furthermore, the insulation layer 13 is omitted in FIG. 5.

It was confirmed that the tilt of the through-hole 12 shown in FIG. 6B becomes pronounced heading towards to the exterior periphery of the silicon substrate 11. Pad peeling is caused by the difference in stretching directions of a conduction material (copper (Cu) or a copper alloy) in the conduction part 122 after annealing between the through-hole 12 (region A) at the center part where tilt does not occur and the through-hole 12 (region B) where tilt occurs. That is, the thermal expansion coefficient of copper (Cu) in the case of using copper (Cu) as a conductive material is 17.5 [PPM] and the thermal expansion coefficient of silicon (Si) of the silicon substrate 11 is 4 [PPM]. Transformations are produced in the through-hole 12 during an anneal process due to the difference in these thermal expansion coefficients. Because tilt does not occur in the through-hole electrode 14 formed at the center of the silicon substrate 11, stretching of copper (Cu) occurs in only one direction during the anneal process, returns to its original state after the anneal process and there is not effect on the pad of the land 15. However, because tilt occurs in the through-hole electrode 14 which his formed on the exterior periphery of the silicon substrate 11, the stretching direction of the copper (Cu) during an anneal process becomes complex, the copper does not return to its original state after the anneal process and pad peeling etc occurs in the pad of the land 15.

In addition, it was confirmed that any remaining gas (water ($H_2O$) or hydrogen ($H_2$) etc) in the metal material such as copper (Cu) filled as the through-hole electrode 14 described above, and the silicon substrate 11 was discharged during the annealing process. In the case where a heating temperature is raised to 300° C., 400° C., the discharged amount of water ($H_2O$) and hydrogen ($H_2$) increases. The reason for the increase in the amount of discharged water ($H_2O$) and hydrogen ($H_2$) is that after the plating resist 124 is removed by a chemical process and the seed layer 123 is removed by etching, a slight gap is formed at the boundary section between the insulation film 13 and the through-hole electrode 14. It was confirmed that when the gas (water ($H_2O$) and hydrogen ($H_2$) etc) which is discharged from the interior of the through-hole electrode builds up in the gap which is produced at this boundary section, the land 15 is pushed up, and defects such as blow off are produced.

Furthermore, in the through-hole electrode substrate 100 of the present embodiment, a resin layer 101 is formed on the upper surface and lower surface of the silicon substrate 11 and given a buffer layer function for buffering a transformation in the through-hole electrode 14. In addition, the resin layer 101 may also be given a gas discharge function which discharges the gas which is discharged from the through-hole electrode 14 to the exterior. However, when tilt occurs in the through-hole electrode 14 stated above, a misalignment occurs between the formation position of the through-hole electrode 14 and the position of an opening 101a which is formed on the resin layer 101, and [step out] or [disconnection] occur as exemplified in FIG. 7 and FIG. 8. [step out] means a misaligned so that a part of the position of the opening 101a formed on the resin layer 101 and the open position of the through-hole electrode 12 overlap. [disconnection] means a part of the position of the opening 101a formed on the resin layer 101 and the open position of the through-hole electrode 12 do not match.

FIG. 7 is a cross sectional diagram of the through-hole electrode 100 formed with the resin layer 101, and shows the state where tilt occurs in the through-hole electrode 14 formed the periphery part among a plurality of through-hole electrodes 14. A view of the region A and region B in the diagram seen from the lower surface side is shown in FIG. 8A and FIG. 8B. The region A shown in FIG. 8A shows that [step out] occurs at the opening 101a of the resin layer 101 with respect to the lower surface of the through-hole electrode 14 in which tilt occurs. The region B shown in FIG. 8B shows that [disconnection] occur at the opening 101a of the resin layer 101 with respect to the lower surface of the through-hole electrode 14 in which tilt occurs. Furthermore, when [step out] occurs, because a part of the contact between the lower surface of the through-hole electrode 14 and an electrode pad of the land 15 is misaligned there is a possibility of conduction defects. In addition, when [disconnection] occur, there is no contact between the lower surface of the through-hole electrode 14 and the electrode pad of the land 15 which causes conduction defects.

Figure 9:
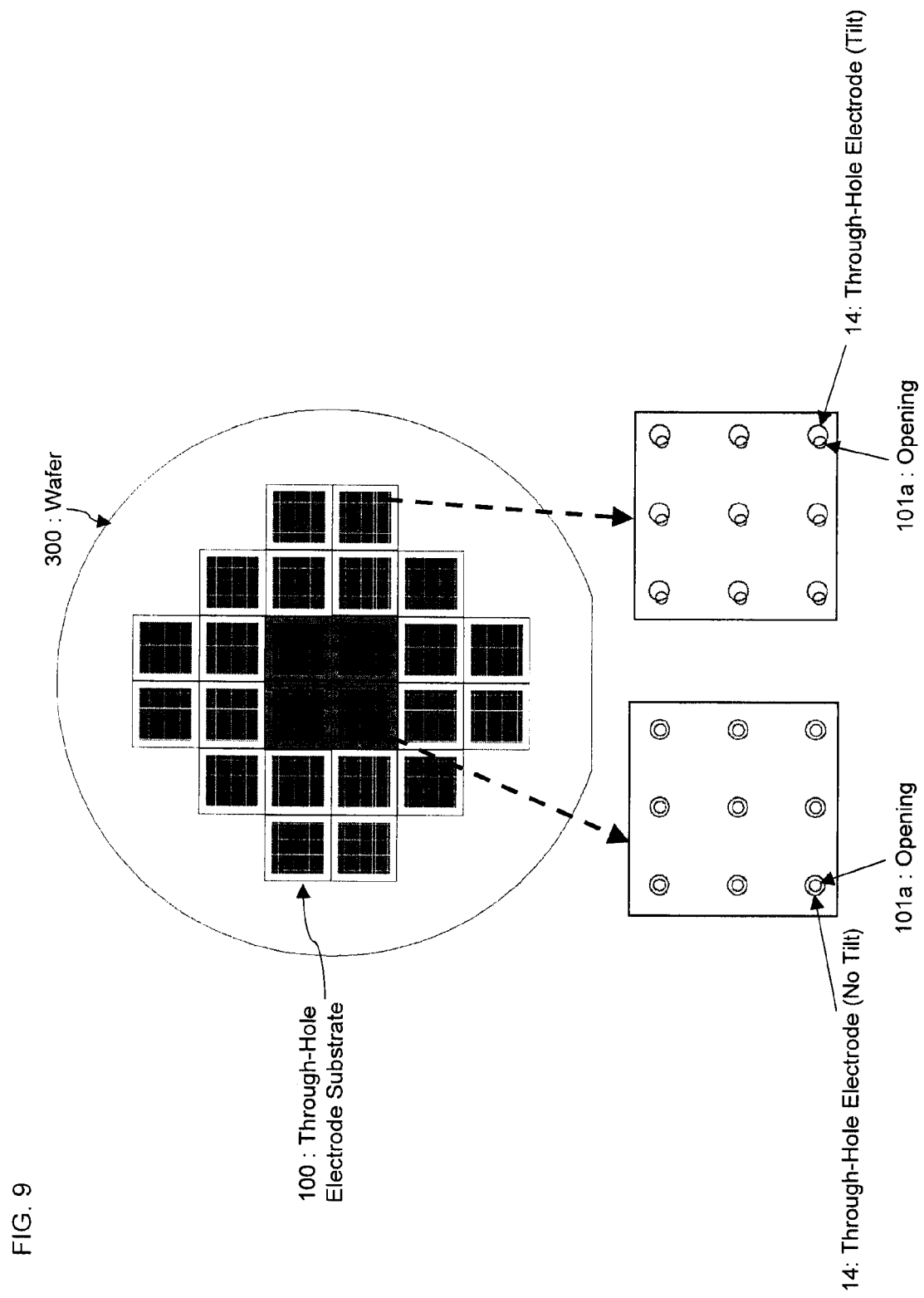
FIG. 9 is a diagram which shows an example whereby a plurality of conventional chip shaped through-hole electrode substrate are formed within a wafer.

When it is judged that [step out] or [disconnection] shown in FIG. 8A and FIG. 8B have occurred, because there is a possibility of conduction defects being generated between the through-hole electrode 14 and electrode pad of the land 15, it is considered defective. As a result, for example, twenty four chips worth of through-hole electrode substrates 100 are formed within the wafer 300 shown in FIG. 9 and tilt does not occur in the through-hole electrodes 14 in the four chips formed in the center of the wafer 300 and [step out] and [disconnection] do not occur in the opening 101a of the resin layer 101 with respect to the formation position of the through-hole electrode 14. Consequently, these four chips are considered non-defective products. In addition, as is shown in FIG. 9, because tilt occurs in the through-holes electrodes 14 in the twenty chips which are formed on the periphery of the four chips formed at the center of the wafer 300, [step out] occurs at the opening 101a of the resin layer 101 with respect to the formation position of the through-hole electrode 14. Therefore, these twenty chips are considered defective products.

Therefore, among the plurality of chip shaped through-hole electrode substrates 100 formed in the surface of the wafer 300 shown in FIG. 9, only the four chips formed at the center of the wafer are cut out as non-defective products and the other twenty chips become defective products which lowers yield. Furthermore, the size of the wafer 300 shown in FIG. 9 is 6 inches for example and the chip formation region extends inwards about 15 [mm] from the exterior periphery of the wafer 300. In addition, in this case, each chip size is about 18 [mm]×18 [mm]. Also, it was confirmed that tilt of the through-hole electrodes 14 shown in FIG. 8 and FIG. 9 occurs even if the size of the wafer 300 is increased to 8 inches.
(Correction of an Open Position of a Resin Layer Together with Tilt)

Figure 10:
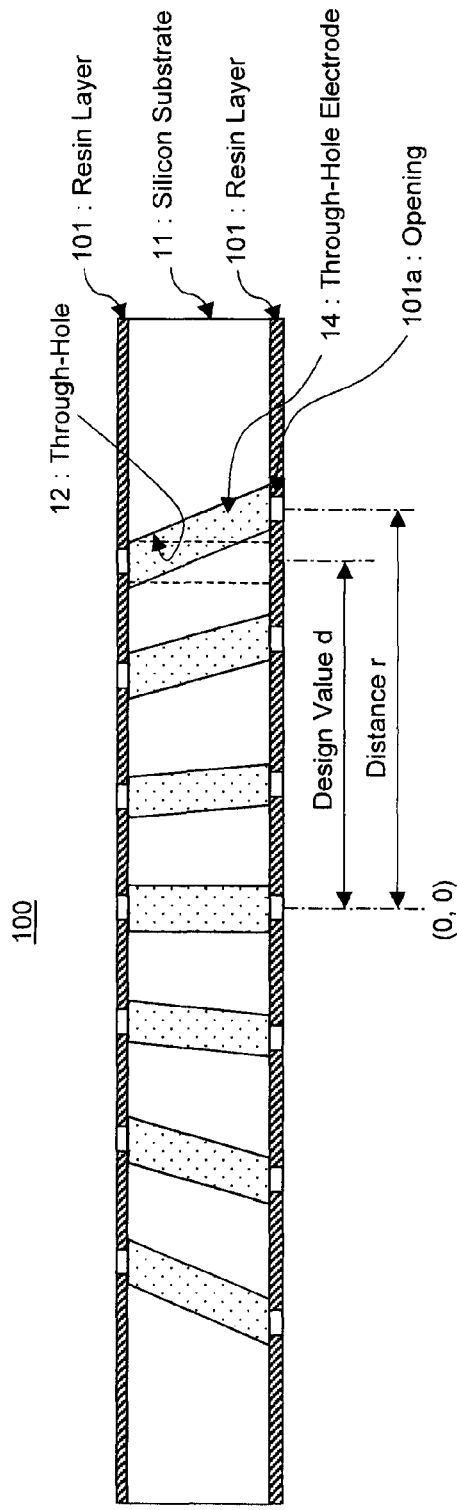
FIG. 10 is a diagram which shows a cross section of a through-hole electrode substrate in which the position of an opening formed in a resin layer is corrected with respect to a tilted through-hole.

In order to manage misalignment of the formation position of the opening 101a of the resin layer together with the tilt of the though hole 12, a process for correcting the position in which the opening 101a of the resin layer 101 is formed while considering tilt of the through-hole 12 is explained while referring to FIG. 10 and FIG. 11.

Figure 11A:
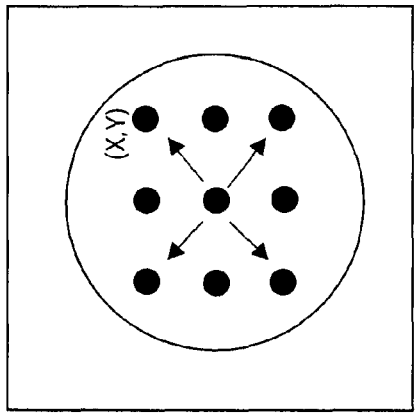
FIG. 11A is a diagram which shows a conventional mask A in which the position of an opening formed in a resin layer is not corrected.

FIG. 10 is a diagram which shows a cross section of a through-hole electrode substrate 100 in which a position of an opening 101a of a resin layer 101 has been corrected with respect to a through-hole electrode 14 formed with tilted through-hole 12. FIG. 11A is a diagram which shows a conventional mask A in which a position of an opening formed on the resin layer 101 has not been corrected, and FIG. 11B is a diagram which shows a proposed mask B in which a position of an opening formed on the resin layer 101 has been corrected.

In FIG. 10, the coordinates at the center of the through-hole electrode substrate are set at (0, 0), a design distance is set as design value d, and a distance up to the actual formation position is set as distance r as a distance from the center of this substrate to the center part of the opening 101a of the resin layer 101. In the present embodiment, the relationship between the design value d and distance r of each open position is measured in advance. For example, the through-hole electrode substrate 100 is manufactured by the above described manufacturing method and the distance r from the center of the substrate to the center of each open position is measured. A correction function a=r/d which determines the amount of correction of each open position formed in the resin layer 101 is measured in advance based on the difference between the measured distance r and the design value d.

Figure 11B:
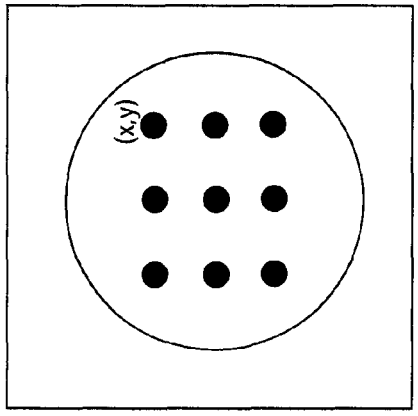
FIG. 11B is a diagram which shows a mask B of the present invention in which the position of an opening formed in a resin layer is corrected.
Figure 12:
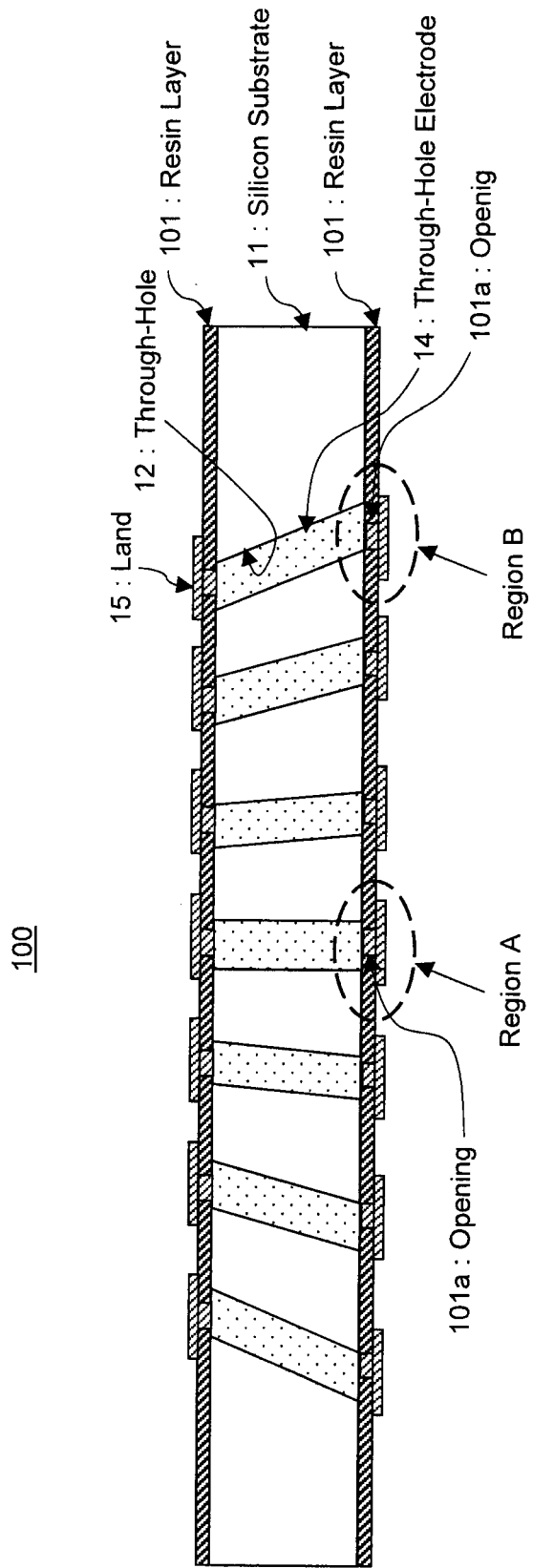
FIG. 12 is a diagram which shows a cross section of a through-hole electrode substrate manufactured using the mask B show in FIG. 11 (B)

In FIG. 11, the position (shown by the coordinates (x, y)) of each opening 101a formed in the resin layer 101 is not corrected by the conventional mask A shown in FIG. 11A. As a result, in the case where the opening 101a is formed in the resin layer 101 using this mask A, there is a possibility that [step out] or [disconnection] in the opening 101a shown in FIG. 8 and FIG. 9 will occur. Alternatively, the position (shown by the corrected coordinates (X, Y)) of each opening 101a formed in the resin layer 101 is corrected based on the above described correction function a by the proposed mask B shown in FIG. 11B. In this case, the correction coordinates (X, Y) are corrected as X=ax, Y=ay by multiplying the correction function a by the original coordinates (x, y). The results of forming the opening 101a in the resin layer 101 using this mask B are shown in FIG. 12 and FIG. 13. Furthermore, the correction function is not limited to the linear function shown. For example, the formation position of the opening 101a made be corrected by measuring the spread/width of the tilted through-hole 12 and the distribution of the dimensions, expressing this distribution as a quadratic curve, measuring a quadratic function from the quadratic curve and using this quadratic function to correct the formation position of the opening 101a. For example, the correction function a=r/d$^2$ which determines the correction amount of the position of each opening is measured, coordinates (x, y) which show the position of each opening 101a are multiplied using this correction function and the coordinates (x, y) may be corrected as X=ax$^2$, Y=ay$^2$. In this way, by correcting the formation position of the opening 101a using a correction function, the center position of the corrected opening 101a moves away with respect to the center position of the tilted through-hole 12.

Figure 13A:
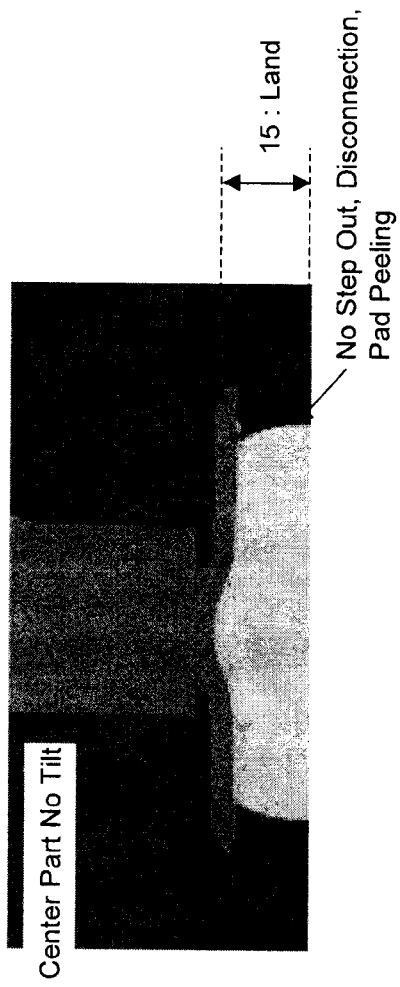
FIG. 13A is a SEM photograph of a region A shown in FIG. 12.
Figure 13B:
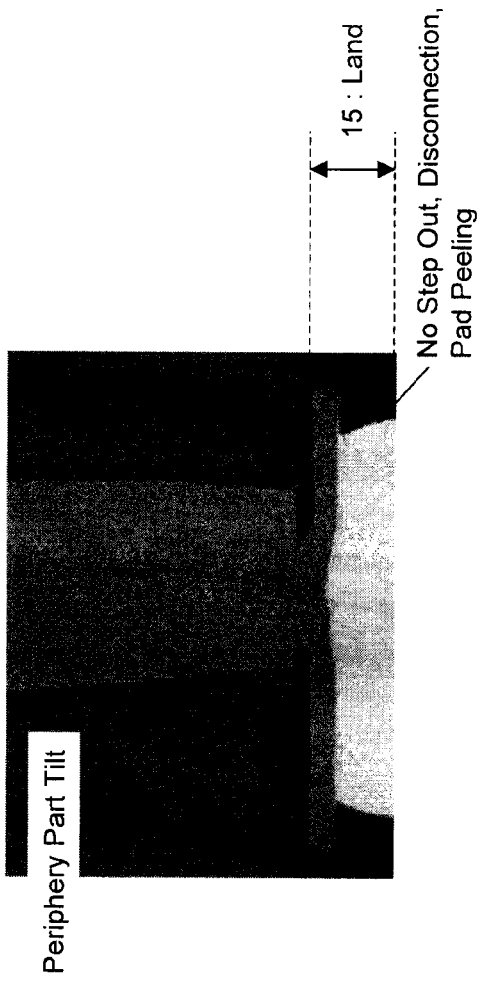
FIG. 13B is a SEM photograph of a region B shown in FIG. 12.

FIG. 12 is a diagram which shows a cross section of the through-hole electrode substrate 100 manufactured using the mask B shown in FIG. 11B in the manufacturing process described above. Each SEM photograph of the region A shown in the center of this through-hole electrode substrate and the region B shown in the periphery part are shown in FIG. 13. FIG. 13A is a SEM photograph of the region A. Because tilt does not occur in the through-hole electrode 14 formed in the center of the through-hole electrode substrate 100, [step out] or [disconnection] does not occur in the opening 101a formed in the resin layer 101, and pad peeling also does not occur. FIG. 13B is a SEM photograph of the region B. Tilt occurs in the through-hole electrode 14 formed in the periphery part of the through-hole electrode substrate 100. However, the position of the opening 101a formed in the resin layer 101 is corrected to a position corresponding to the tilt by the mask B. As a result, [step out] or [disconnection] do not occur in the opening 101a formed in the resin layer 101 and pad peeling also does not occur.

(Gas Discharge Effects Via the Resin Layer)

Figure 14:
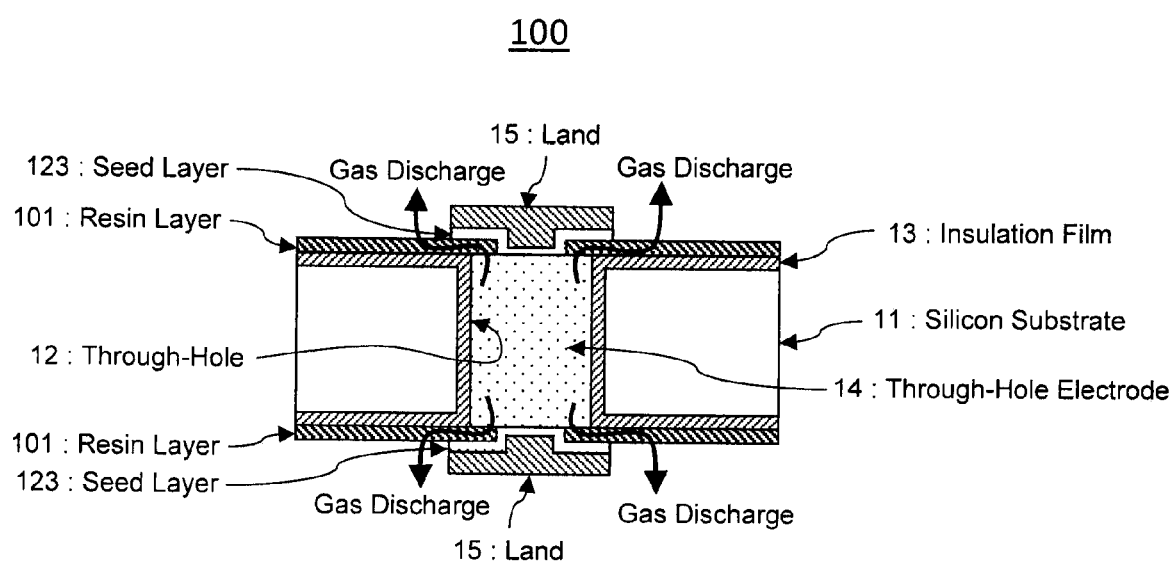
FIG. 14 is a diagram which shows a gas discharge of a resin layer of the through-hole electrode substrate related to the first embodiment.

The through-hole electrode substrate 100 related to the present first embodiment is formed with the resin layer 101 so as to cover a boundary part between the insulation film 13 which is exposed on the surface of the silicon substrate 11 and one part of the through-hole electrode 14. In addition, because the resin layer 101 has a larger molecular structure than the gas (water ($H_2O$) or hydrogen ($H_2$)) molecules discharged from the interior of the through-hole electrode 14, it is possible to discharge this gas to the exterior. That is, as is shown in FIG. 14, in an anneal process, the gas (water ($H_2O$) or hydrogen ($H_2$)) discharged from the interior of the through-hole electrode 14 is discharged to the exterior via the resin layer 101. Furthermore, the area of the resin layer 101 in contact with the through-hole electrode 14 which is exposed on the surface of the silicon substrate 11 may be 20% to 80% for example with respect to the entire exposed area of the through-hole electrode 14. In addition, the thickness of the resin layer 101 may be 1 [μm] to 20 [μm] and more preferably 3 [μm] to 8 [μm]. Each value of the contact area and thickness of the resin layer 101 is not particularly limited and may be any value sufficient for demonstrating the above described gas discharge effects.

As a result, it is possible to prevent the occurrence of phenomena such as pad peeling described above. In this way, in the case where a resin layer 101 is added to the through-hole electrode substrate 100, in addition the effects of discharging gas to the exterior from the interior of the through-hole electrode 14 it was determined that the invention has the effects of reduce stretching of copper (Cu) etc filled as the through-hole electrode 14, and preventing the occurrence of defects (buffer effects) such as raising of the land 15 or blow off.

As stated above, in the through-hole electrode substrate 100 shown in the first embodiment, it is possible to discharge the gas discharged from the interior of the through-hole electrode 14 formed by filling a metal material (copper (Cu) etc) into the through-hole 12 which is formed in the silicon substrate 11 by a newly arranged resin layer 101. In addition, it was clear that this resin layer 101 has the effects (buffer effects) of reducing stretching of the filled copper (Cu) etc. As a result, it is possible to prevent the occurrence of phenomena such as pad peeling.

Figure 15:
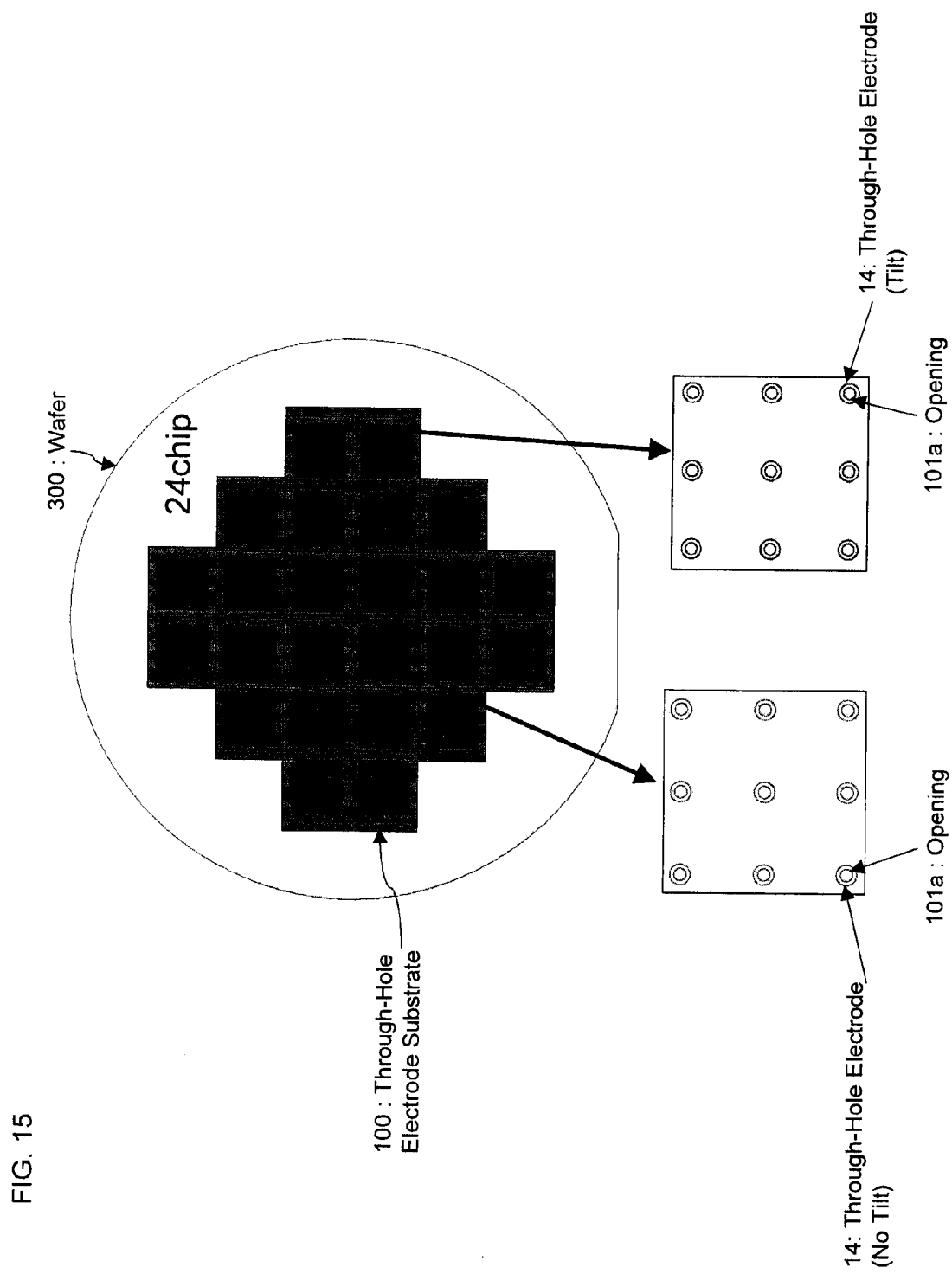
FIG. 15 is a diagram which shows an example wherein a plurality of chip shaped though hole electrode substrate are formed in a wafer related to the first embodiment.

In addition, in the through-hole electrode substrate 100 shown in the first embodiment, when forming the through-hole 12 the position of the opening 101a formed in the resin layer 101 is corrected with respect to the occurrence of a tilt in the through-hole 12 which gradually leans from the center of the silicon substrate 11 towards the periphery part. As a result, it is possible to prevent [step out] or [disconnection] of an electrode pad which conducts with the through-hole electrode 14. As a result, when forming a plurality of chip shaped through-hole electrode substrates 100 in a wafer, it is possible to reduce defective chips due to [step out] or [disconnection] of an electrode pad and it is possible to improve yield. A plurality of chip shaped through-hole electrode substrates 100 in which the position of the opening 101a formed in the resin layer 101 is corrected is shown formed in a wafer in FIG. 15. FIG. 15 shows the case where twenty four chips worth of through-hole electrode substrates 100 are formed on a six inch wafer 300 as is shown in FIG. 9. In this case, as a result of performing a process for correcting the open position described above [step out] or [disconnection] does not occur in the opening 101a of the resin layer 101 with respect to a tilt in any of the through-hole electrodes 14 in each chip on the periphery of the wafer 300. Therefore, all of the twenty four chips worth of through-hole electrode substrates 100 are non-defective products.

(Second Embodiment)

The second embodiment of the present invention will be explained in detail below while referring to the drawings.

(Structure of a Through-Hole Electrode Substrate)

Figure 16:
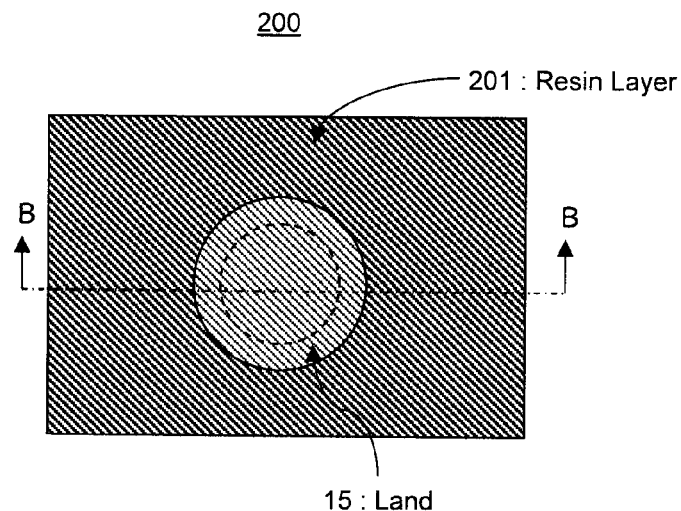
FIG. 16 is a planar view diagram which shows a structure of a through-hole electrode substrate related to a second embodiment.
Figure 17:
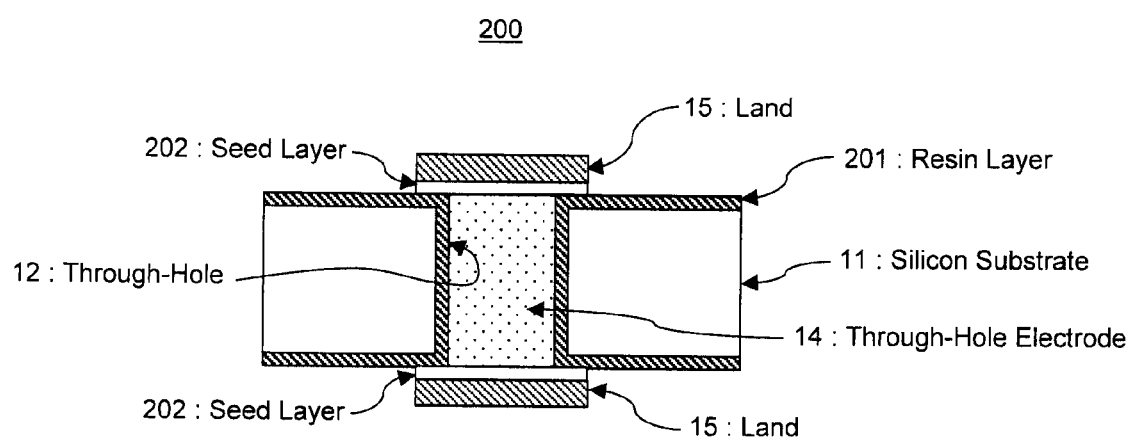
FIG. 17 is a cross sectional diagram which shows a structure of the through-hole electrode substrate shows in FIG. 16 seen from the line B-B.

The structure of a through-hole electrode substrate 200 related to the second embodiment is explained while referring to FIG. 16 and FIG. 17. FIG. 16 is a planar view diagram of the through-hole electrode substrate 200 seen from an upper surface. FIG. 17 is a cross sectional diagram see from the line B-B in FIG. 10. The same structural components as in the through-hole electrode substrate 100 shown in FIG. 1 and FIG. 2 are attached with the same reference symbols. In the through-hole electrode substrate 200 shown in FIG. 16 and FIG. 17, a resin layer 201 is formed on an upper and lower surface of a silicon substrate 11 and the interior wall of a through-hole 12. The resin layer 201 may be formed using an inorganic insulation film such as a silicon oxide film or a silicon nitride film. In addition, the resin layer 201 is preferred to be an insulation film having a gas discharge function using a resin material such as polyimide. In this case, the resin layer 201 is arranged for discharging gas which is discharged from within the through-hole electrode 14 to the exterior. That is, in the second embodiment, the resin layer 201 may be arranged as a gas discharge part. Furthermore, the resin layer 201 causes peeling (raised parts) of a pad in the land 15 together with stretching of a metal material such as copper (Cu) etc which is filled as the through-hole electrode 14 in an anneal process but is also arranged for demonstrating buffer effects by functioning as a buffer layer for relieving stretching of the metal material.

(Manufacturing Method of the Through-Hole Electrode Substrate)

Next, a process for manufacturing the through-hole electrode substrate 200 is explained while referring to FIG. 18 and FIG. 19. FIG. 18A to FIG. 18E are diagrams which shows the sequence of processes for forming a through-hole electrode on the silicon substrate 11. Furthermore, in FIG. 18A to FIG. 18E, only one though hole electrode 14 is shown formed on the silicon substrate 11 in order to simplify the explanation. In an actual silicon substrate 11, a plurality of through-hole electrodes having a desired hole diameter (for example, 10 [μm] to 100 [μm]) are formed at desired intervals depending on the specifications.

Figure 18A:
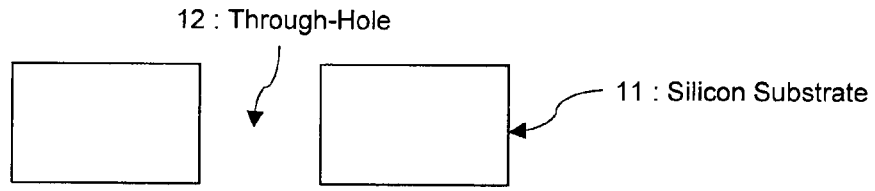
FIG. 18A is a diagram which shows a process for forming a through-hole related to the second embodiment.

(1) Forming a Through-Hole First, in FIG. 18A, the silicon substrate 11 is etched and a hole (not shown in the diagram) which does not pass completely through the substrate is formed on one surface of the silicon substrate 11 using a method such as RIE, DeepRIE, light etching or wet etching. Next, the silicon substrate 11 is thinned by a method such as grinding from the other surface of the silicon substrate 11, that is, the surface opposite to the surface on which the hole is formed and the hole passes completely through the substrate forming the through-hole 12.

(6) Forming a Resin Layer

Figure 18B:
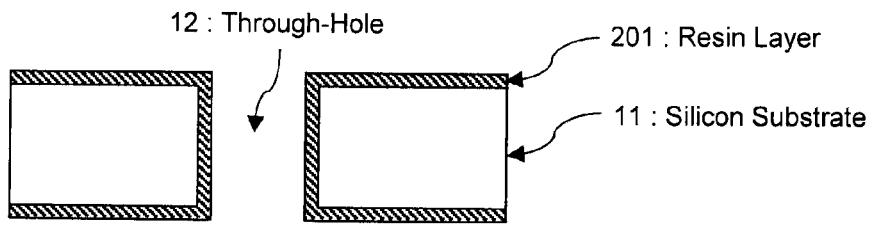
FIG. 18B is a diagram which shows a process for forming a resin layer related to the second embodiment.

Next, in FIG. 18B, a resin layer 201 is formed as an insulation layer (a first insulation layer, a second insulation layer, and a third insulation layer) on the upper and lower surfaces of the silicon substrate 11 and the interior wall of the through-hole 12. This resin layer 201 is formed by a spray coat method. It is possible to use a material shown in the first embodiment described above as the resin layer 201.

In addition, it is known that scallops (a rough waveline shape) are produced on the interior wall of the through-hole 12 in the case where the through-hole 12 described above is formed by DeepRIE. In the present second embodiment, by forming the resin layer 201 on the interior wall of the through-hole 12 it is possible to cover the scallops without gaps and planarize the interior wall of the through-hole 12.

(3) Forming a Seed Layer

Figure 18C:
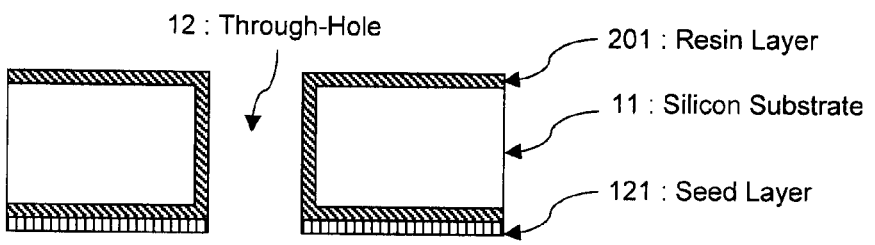
FIG. 18C is a diagram which shows a process for forming a seed layer related to the second embodiment.

Next, in FIG. 18C, a seed layer 121 is formed on the lower surface side of the silicon substrate 11 formed with the resin layer 201 using a method such as a sputtering method. Furthermore, the seed layer 121 may be formed in one layer using a material such as titanium (Ti) or may be formed in two layers using titanium (Ti) and copper (Cu). In the case where the seed layer 121 is formed in two layers, it is preferred that the copper (Cu) layer be formed as a layer which contacts with the through-hole electrode 14 described below.

(4) Forming a Conducting Part

Figure 18D:
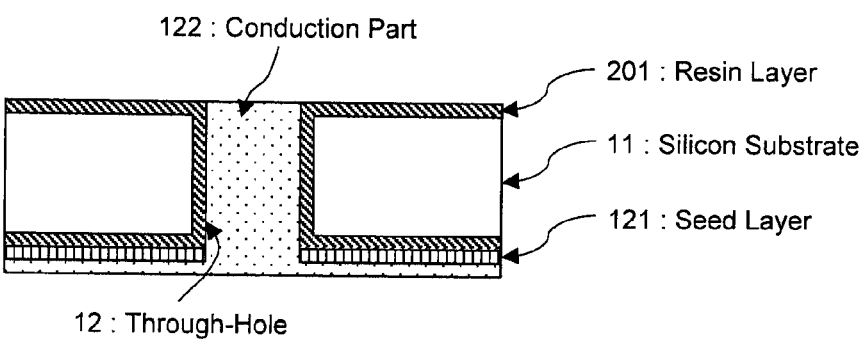
FIG. 18D is a diagram which shows a process for forming a conducting part related to the second embodiment.

Next, in FIG. 18D, the seed layer 121 of the silicon substrate 11 is made into a power supply layer by electrolytic plating and a conducting part 122 is formed by filling a conducting material (copper (Cu), or copper alloy etc) into the through-hole 12. In this case, the conducting part 122 is also formed on the surface on which the seed layer 121 is formed as is shown in FIG. 27D. It is possible to use a sputter method, a non-electrolytic plating method, a molten metal aspiration method, a printing method or CVD method etc for filling the copper (Cu) or copper alloy.

(5) Forming a Through-Hole Electrode

Figure 18E:
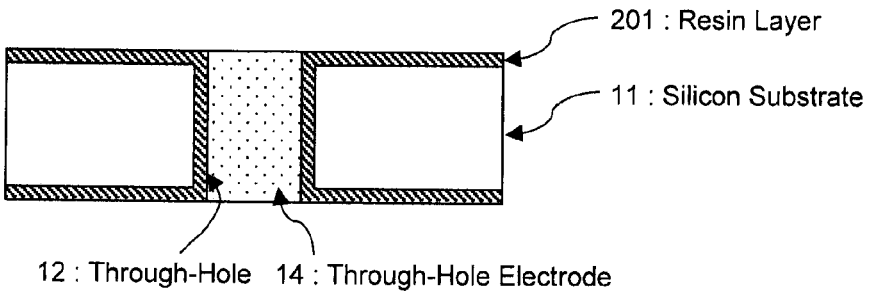
FIG. 18E is a cross section diagram of a completed through-hole electrode related to the second embodiment.

Next, in FIG. 18E, the surface on which the seed layer 121 and the conduction part 122 of the silicon substrate 11 is formed is etched using a method such as CMP, the conduction part 122 and the seed layer 121 are removed and the formation of the through-hole electrode 14 is complete.

(6) Forming a Plating Resist

Figure 19A:
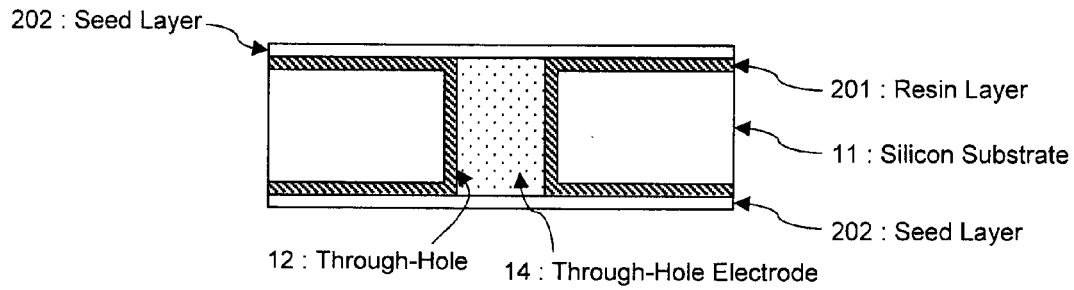
FIG. 19A is a diagram which shows a process for forming a seed layer related to the second embodiment.
Figure 19B:
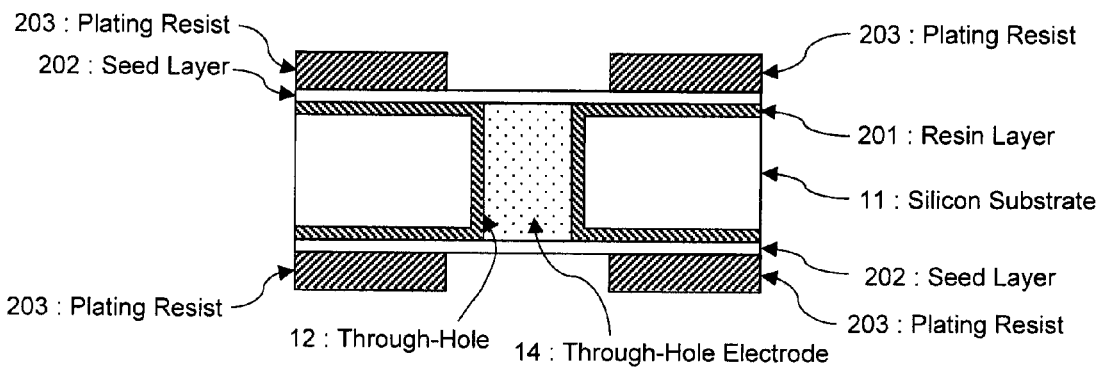
FIG. 19B is a diagram which shows a process for a plate resist related to the second embodiment.

Next, in FIG. 19A, a seed layer 202 is formed on the surface which is formed with the resin layer 201 using a sputtering method. Next, in FIG. 19B, a plating resist is formed on the seed layer 202 using photolithography. Furthermore, the seed layer 202 may be formed as one layer using titanium Ti as a seed material or as two layers using titanium (Ti) and CU (copper).

(7) Forming a Land

Figure 19C:
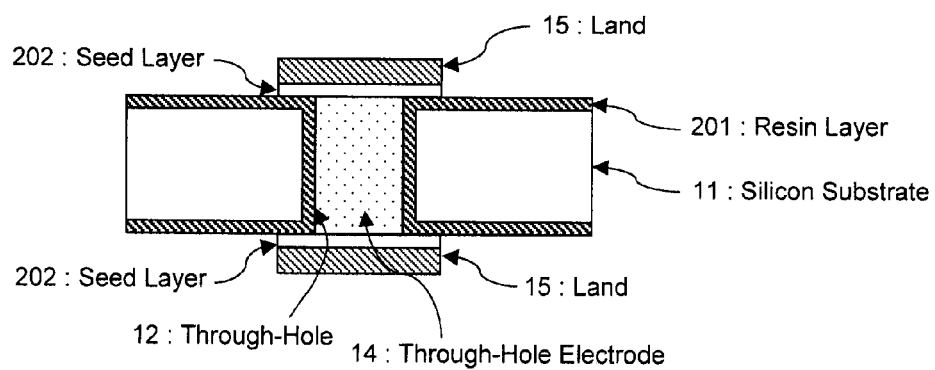
FIG. 19C is a cross sectional diagram of a completed through-hole electrode substrate related to the second embodiment.

Next, in FIG. 19C, a land 15 which becomes wiring and an electrode pad is formed by making the seed layer 202 as a power supply layer by electrolytic plating. The land 15 may be formed using copper (Cu), gold (Au), multi-layer plating (Cu/Ni/Au) or a copper alloy as a material. Next, on the surface on which the land 15 of the silicon substrate 11 is formed, the plating resist 203 is removed by a chemical process, the seed layer 202 is removed by a chemical etching process and formation of the through-hole electrode substrate 200 is complete.

In FIG. 18 and FIG. 19, the case where the resin layer 201 and the land 15 are formed on the upper and lower surfaces of the silicon substrate 11 is shown. However, the resin layer 201 and the land 15 may be similarly formed on only the upper surface or only the lower surface of the silicon substrate 11 by the above described process.

(Gas Discharge Effects Via the Resin Layer)

Figure 20:
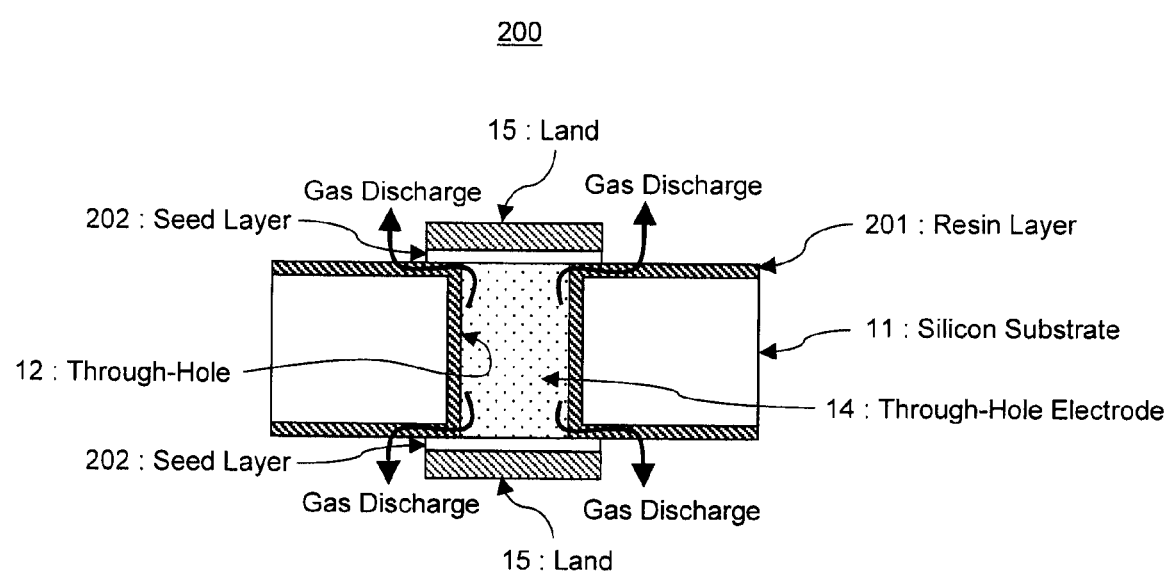
FIG. 20 is a diagram which shows a gas discharge of a resin layer of the through-hole electrode substrate related to the second embodiment.

In the through-hole electrode substrate 200 related to the present second embodiment the resin layer 201 is formed on an interior wall on an upper and lower surface of the silicon substrate 11 and the interior wall of the through-hole 12. In addition, because the resin layer 201 has a larger molecular structure than the gas (water ($H_2O$) or hydrogen ($H_2$)) molecules discharged from the interior of the through-hole electrode 14, it is possible to discharge this gas to the exterior. That is, as is shown in FIG. 20, in an anneal process, the gas (water ($H_2O$) or hydrogen ($H_2$)) discharged from the interior of the through-hole electrode 14 is discharged to the exterior via the resin layer 201. As a result, it is possible to prevent the occurrence of electrode pad peeling as described above.

In this way, in the through-hole electrode substrate 200 described above, in the case where the resin layer 201 is formed on the upper and lower surfaces of the silicon substrate 11, in addition to the effect of discharging a gas discharged from the interior of the through-hole electrode 14 to the exterior it is clear that the present invention has the effects of reducing stretching of copper (Cu) which is filled as the through-hole electrode 14 in a vertical direction (perpendicular direction to the upper and lower surfaces of the silicon substrate 11), and also the effect (buffer effect) of preventing the occurrence of defects such as raising of the land 15 and blow off. In addition, because the resin layer 201 is also formed on the interior wall of the through-hole 12, it is clear that the present invention has the effect of a widening of the copper (Cu) etc which is filled as the through-hole electrode 14 in a horizontal direction (a direction parallel to the upper and lower surface of the silicon substrate 11) and also the effect of preventing the occurrence of cracks within the through-hole electrode 14.

(Correction of a Land Position Together with Tilt)

The tilt of the through-hole electrode 14 as described in the first embodiment similarly occurs in the through-hole electrode substrate 200 related to the present second embodiment. As a result, as described in the first embodiment, in the through-hole electrode substrate 200 the position of the lower surface side land is corrected based on a correction function a. Alternatively, the size of the land is widened to a level which does not cause [step out] or [disconnection]. In addition, for example, an insulation film may be formed on the upper surface and lower surface of the through-hole electrode substrate 200 and a multi-layer structure electrode pad may be formed on each insulation layer. In this case, the electrode pad group related to the tilt is not directly connected with other circuit boards or electrical components and does not become a direct cause of connection defects. As a result, it is possible to prevent the occurrence of [step out] or [disconnection] in electrode pads which conduct with the through-hole electrode 14. As a result, it is becomes possible to reduce the occurrence of defective chips due to [step out] or [disconnection] of the electrode pad and improve yield when forming a plurality of chip shape through-hole electrode substrates 200 in a wafer.

As described above, in the through-hole electrode substrate 200 related to the present second embodiment, it is possible to discharge gas which is discharged from the interior of the through-hole electrode 14 formed by filling a metal material (copper (Cu) etc) into the through-hole 12 formed in the silicon substrate 11, to the exterior via the resin layer 201. In addition, it is clear that the resin layer 201 includes effects (buffer effects) for reducing stretching in a vertical direction and widening in a vertical direction of the filled copper (Cu)

etc. As a result, it is possible to prevent an occurrence of peeling of an electrode pad, improve yield when manufacturing a plurality of chip shaped through-hole electrode substrates 200 in a wafer and improve reliability.

Furthermore, in the through-hole electrode substrate 200 related to the second embodiment, the resin layer 201 is formed as an insulation layer on the upper and lower surfaces of the silicon substrate 11 and the interior wall of the through-hole 12. As a result, when forming the through-hole 12 using a DeepRIE method, it is possible to planarize the interior wall of the through-hole 12 by filling a scallop gap produced in the interior wall of the through-hole, and filling a conductive material (copper (Cu) or a copper alloy etc) into the through-hole 12 using a plating method etc can be performed better.

Furthermore, in the through-hole electrode 100 and 200 related to the first and second embodiments, a single layer structure formed with a through-hole electrode 14, resin layers 101, 201 and a land 15 on the silicon substrate 11 is shown. In the single structure through-hole electrode substrates 100, 200, [step out] or [disconnection] in an electrode pad which conducts with the through-hole electrode 14, in the case where the through-hole electrode substrates 100, 200 are used as an interposer, because the electrode pad is directly connected with other circuit boards or electrical components, it becomes a direct cause for producing connection defects which is not acceptable.

(Third Embodiment)

In the third embodiment an example of an electronic circuit board which uses the through-hole electrode substrate 100, 200 shown in the first and second embodiments as an interposer is explained.

Figure 21:
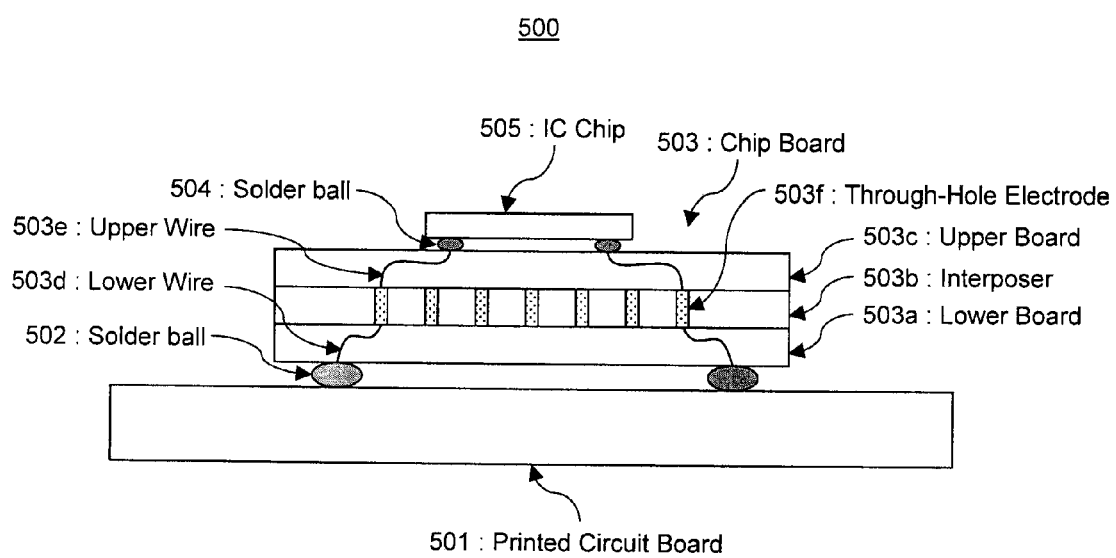
FIG. 21 is a diagram which shows a structure of an electronic circuit board applied with a through-hole electrode substrate related to a third embodiment.

FIG. 21 is a diagram which shows a structure of an electronic circuit board 500 which uses the through-hole electrode substrates 100, 200 shown in the first and second embodiments as an interposer 503b. In FIG. 21, the electronic circuit board 500 is arranged with a printed circuit board 501, and a chip board 503 comprised of a lower layer board 503a, an interposer 503b and an upper layer board 503c. A plurality of solder balls 502 are formed on the upper surface of the printed circuit board 501, and the printed circuit board 501 and the chip board 503 are electrically connected via the plurality of solder balls 502. A plurality of solder balls 504 are formed in the upper surface of the chip board 503, and the chip board 503 and an IC chip 505 are electrically connected via the plurality of solder balls 504.

Lower layer wiring 503d is formed on the lower layer board 503a in order to electrically connect the solder balls 502 and a through-hole electrode 503f of the interposer 503b. The lower layer wiring 503d is formed to match the formation position of the solder balls 502 and the formation position of the through-hole electrode 503f of the interposer 503b. Upper layer wiring 503e is formed on the upper layer board 503c in order to electrically connect the solder balls 504 and a through-hole electrode 503f of the interposer 503b. The upper layer wiring 503e is formed to match the formation position of the through-hole electrode 503f of the interposer 503b and the formation position of the solder balls 504.

The interposer 503b is electrically connected with a lower layer wiring 503d formed in the lower layer board 503a via a plurality of through-hole electrodes 503f, and an upper layer wiring 503e formed on the upper layer board 503c. As is shown in FIG. 21, it is possible to mount the IC chip 505 at high level of density via the chip board 503 without changing the wiring pattern (not shown in the diagram) of the printed circuit board 501 by applying the interposer 503b to the interior of the chip board 503.

As described above, by forming the electronic circuit board 500 using the through-hole electrode substrates 100, 200 as the interposer 503b it is possible to mount the IC chip 505 at high level of density on the printed circuit board 501. Therefore, it is possible to contribute to the miniaturization of an electronic device by applying the electronic circuit board 500 to an electronic device.

Furthermore, in the third embodiment, an example where the through-hole electrode substrates 100, 200 are used as the interposer 503b of the electronic circuit board 500 is shown. However, the present invention is not limited to this. For example, the example may also be applied to various electronic devices in which a high level of mounting density is desired such as mobile phones, computers and IC tester probe cards etc.

(Fourth Embodiment)

In the fourth embodiment, the process for correcting the position of the opening 101a formed on the resin layer 101 together with tilt of the through-hole 12 described above is explained while referring to FIG. 23, FIG. 24, FIG. 25 and FIG. 26. In the first embodiment described above, in the case where the tilt of through-hole 12 becomes larger as the distance increases from the center part of the through-hole electrode substrate, the case where the formation position of the opening is corrected using a correction function (linear function, or quadratic function) is shown. In the fourth embodiment, the case is explained where the formation position of the opening is corrected in the case where tilt of the through-hole 12 is produced randomly regardless of the position within the through-hole electrode substrate.

Figure 23:
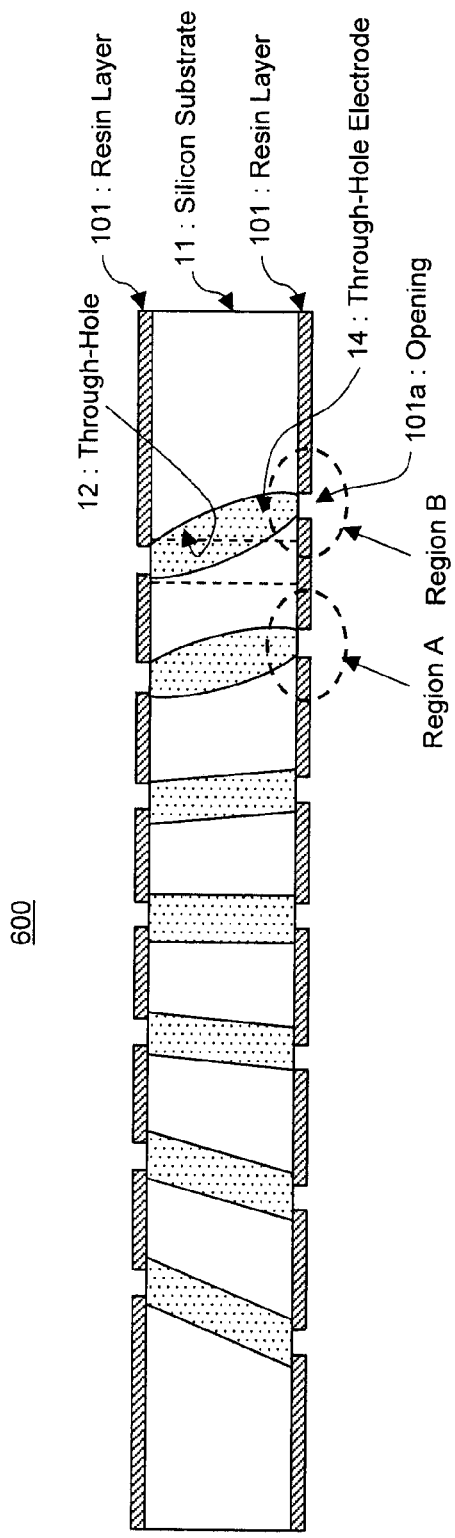
FIG. 23 is a cross sectional diagram of a through-hole electrode substrate in which the shape of the through-hole is transformed related to a fourth embodiment is transformed.
Figure 24:
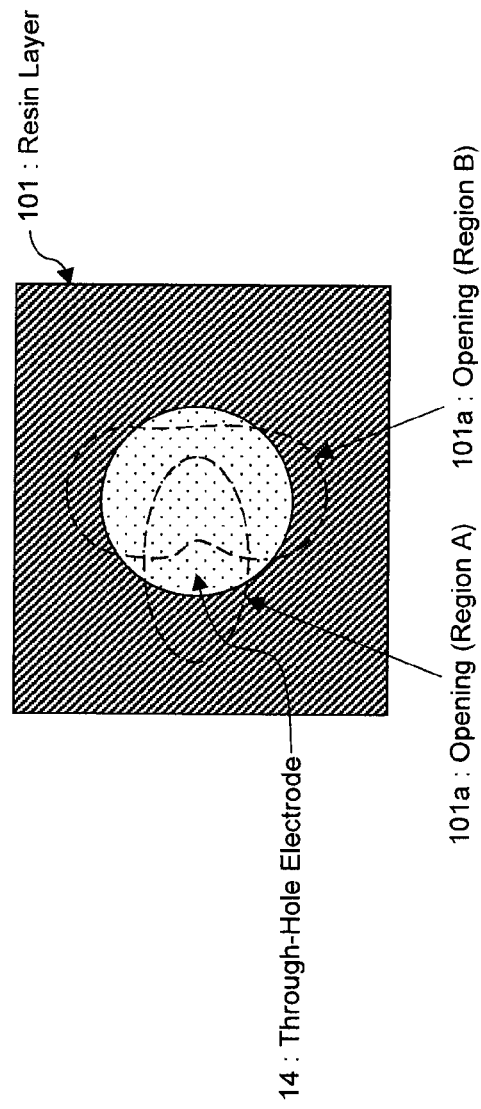
FIG. 24 is a diagram which shows [step out] of an opening in a region A and a region B shown in FIG. 23.

First, the case where tilt of the through-hole 12 is produced randomly is explained while referring to FIG. 23 and FIG. 24. FIG. 23 is a cross sectional diagram of a through-hole electrode substrate 600 formed with a resin layer 101, and shows the state of a change in shape and production of tilt in a through-hole 12 formed on a periphery part among a plurality of through-hole electrodes 14. A view of region A and region B in the diagram seen from a lower surface side is shown in FIG. 24. In the region A shown in FIG. 24, the shape of the opening 101a of the resin layer 101 is transformed to an elliptical shape and [step out] is produced with respect to a lower surface of the through-hole electrode 14 in which a transformation in shape and tilt of the through-hole 12 is produced. In the region B shown in FIG. 24, the shape of the opening 101a of the resin layer 101 is transformed to an indeterminate shape and [step out] is produced with respect to a lower surface of the through-hole electrode 14 in which a transformation in shape and tilt of the through-hole 12 is produced. In this way, in the through-hole electrode substrate 600, in the case where random tilt is produced in the through-hole electrode 14 together with a transformation in shape of the through-hole 12, because there is a loss of contact of a part between the lower surface of the through-hole electrode 14 and the electrode pad of the land 15 due to [step out] produced by various transformations in the shape of the opening 101a of the resin layer 101, there is a possibility of defects in conductivity.

(Correction of Open Position of Resin Layer Together with Tilt)

The amount of tilt of each through-hole 12 is measured and the position in which the opening 101a of the resin layer 101 is formed is corrected in order to manage a misalignment in the formation position of the opening 101a of the resin layer 101 together with the random tilt of the through-hole 12 as is shown in FIG. 23 and FIG. 24. This process is explained while referring to FIG. 25 and FIG. 26.

Figure 25:
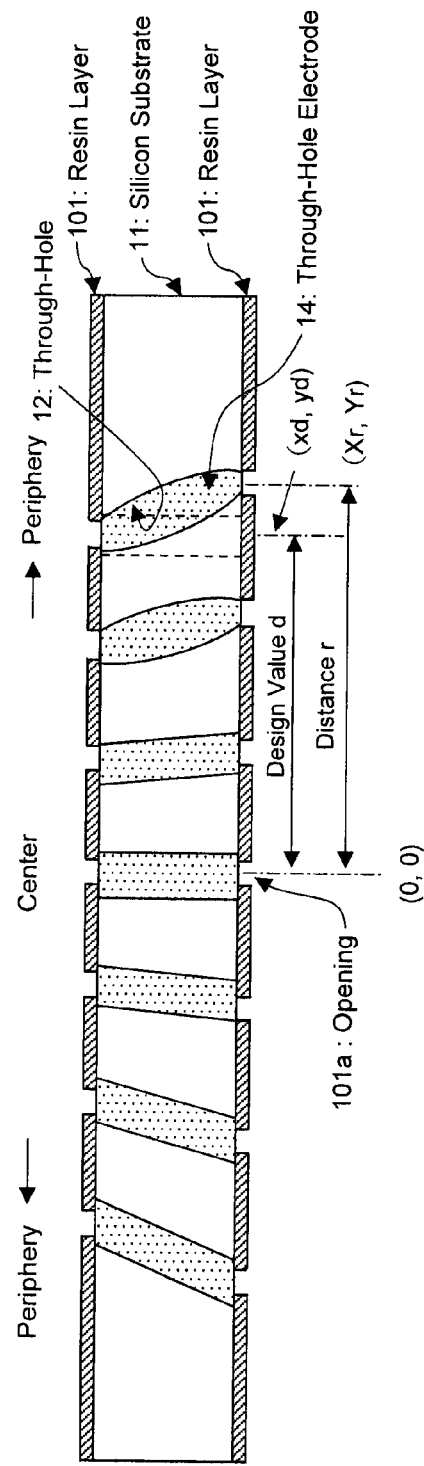
FIG. 25 is a cross sectional diagram of the through-hole electrode substrate formed with a resin layer related to the fourth embodiment.
Figure 26A:
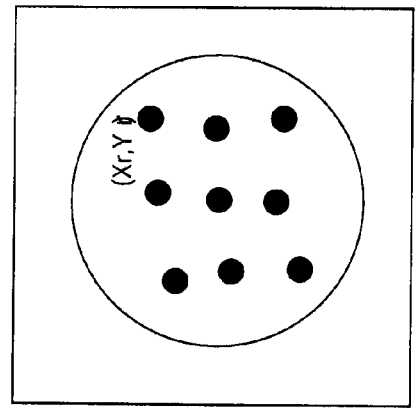
FIG. 26A is a diagram which shows a conventional mask A in which the position of an opening formed in a resin layer is not corrected.

FIG. 25 is a diagram which shows a cross section of the through-hole electrode substrate 100 in which the position of the opening 101a formed in the resin layer 100 is corrected with respect to the through-hole electrode 14 formed in the tilted through-hole 12. FIG. 26A shows a conventional mask A in which the position of the opening formed in the resin layer 101 is not corrected and FIG. 26B shows a proposed mask B in which the position of the opening formed in the resin layer 101 is corrected.

In FIG. 25, the coordinates of the center part of the through-hole electrode substrate 100 are set at (0, 0), and a design distance is set as design value d and a distance up to the actual formation position is set as distance r as a distance from the center of this substrate to the center part of the opening 101a of the resin layer 101. FIG. 25 and FIG. 26, the coordinates corresponding to the design value of each open position are set at (xd, yd), and the coordinates corresponding to each open position after correction are set to (Xr, Xr). In this case, the coordinates (xd, yd) corresponding to the design value d are corrected based on the difference between the design value d and the distance r and the coordinates (Xr, Xr) in which correcting the position of each open formed in the resin layer 101 are measured.

Figure 26B:
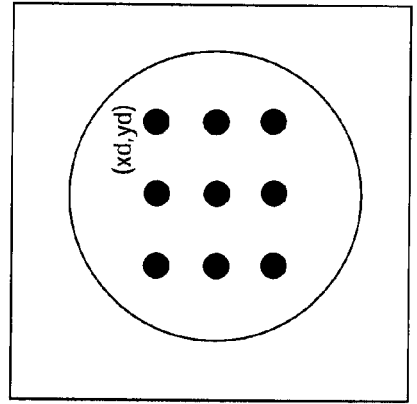
FIG. 26B is a diagram which shows a proposed mask B in which the position of an opening formed in a resin layer is corrected.

As described above, the coordinates (Xr, Xr) for correcting the position of each opening formed in the resin layer 101 are measured based on the difference between the design value d and the distance r, and by forming the opening 101a in the resin layer 101 using these coordinates (Xr, Xr), it is possible to obtain the mask B after correction shown in FIG. 26B. Therefore, even in the case where the through-hole 12 is randomly titled, it is possible to appropriately correct the formation position of each opening 101a formed in the resin layer 101 by measuring the coordinates (Xr, Xr) for correcting the position of each opening formed in the resin layer 101 based on the difference between the design value d of the position of each opening and the distance r to the actual formation position of each opening. As a result, it is possible to reduce the production of defects chips caused by [step out] or [disconnection] in an electrode pad and improve yield when forming a plurality of chip shaped through-hole electrode substrates 200 in a wafer.

(Fifth Embodiment)

In the fifth embodiment, a correction function for correcting the formation position of the opening described above is explained. In the first embodiment described above, an example of a linear function and a quadratic function was explained, however, in the fifth embodiment, an example of various correction functions is explained while referring to FIG. 27 and FIG. 28.

FIG. 27A is a graph which exemplifies a linear function as a correction function. In FIG. 27A, the vertical axis shows the amount of correction and the horizontal axis shows the range from the center to the periphery of the through-hole electrode substrate as a formation position of an opening. In this case, the amount of correction of a formation position of an opening increases continuously heading to the periphery from the center of the through-hole electrode substrate. In the case of correcting the formation position of each opening using this correction function, the formation position of each opening formed in a resin layer widens gradually in the periphery direction heading from the center to the periphery of the through-hole electrode substrate. That is, the formation position is corrected as is shown in FIG. 10B.

FIG. 27B is a graph which exemplifies a function which sets the amount of correction in steps as the correction function. In FIG. 27B, the vertical axis shows the amount of correction and the horizontal axis shows the range from the center to the periphery of the through-hole electrode substrate as the formation position of an opening. In this case, the amount of correction of a formation position of an opening increases in steps in every region, region A, region B, region C and region D shown in the diagram, in the range from the center to the periphery of the through-hole electrode substrate. In the case of correcting the formation position of each opening using this correction function, the formation position of each opening formed in a resin layer widens in steps in the periphery direction in each region, region A, region B, region C and region D, in the range from the center to the periphery of the through-hole electrode substrate.

FIG. 27C is a graph which exemplifies a function which sets the amount of correction locally as the correction function. In FIG. 27C, the vertical axis shows the amount of correction and the horizontal axis the range from the center to the periphery of the through-hole electrode substrate as the formation position of an aperture. In this case, the amount of correction of the formation position of the opening increases locally in the region B show in the diagram, in the range from the center to the periphery of the through-hole electrode substrate. In the case of correcting the formation position of each opening using this correction function, the formation position of each opening formed in the resin layer widens locally in a periphery direction in the region B, in the range from the center to the periphery of the through-hole electrode substrate.

As described above, the correction function shown in FIG. 27A, FIG. 27B and FIG. 27C may be applied as the correction function for correcting the formation position of the opening described above. Therefore, by preparing these correction functions in advance, it is possible to understand the state of the tilt produced in a through-hole and appropriately select a correction function for correcting the formation position of an opening when manufacturing the through-hole electrode substrate.

Figure 28A:
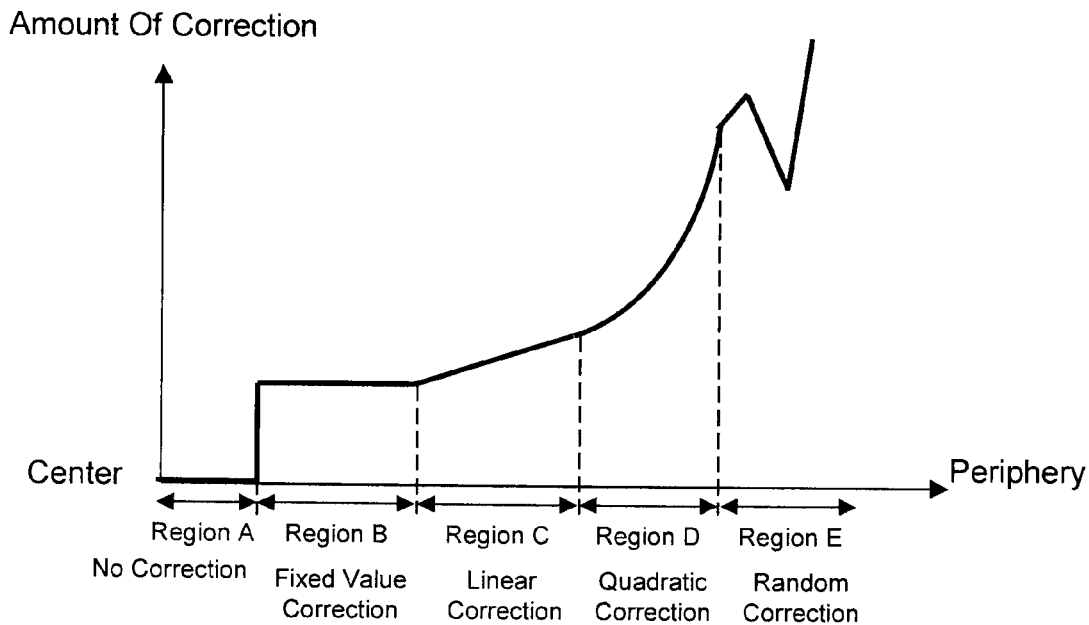
FIG. 28A is a diagram which shows an example in which a correction function changes for each region of the though hole electrode substrate related to the fifth embodiment.
Figure 28B:
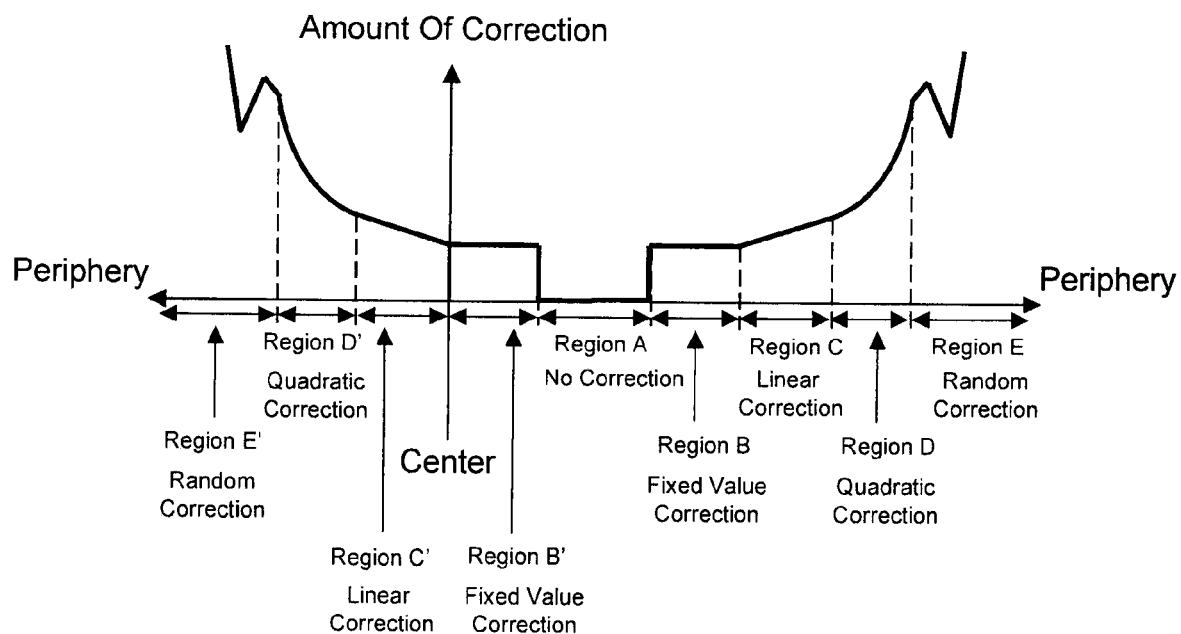
FIG. 28B is a diagram which shows another example in which a correction function changes for each region of the though hole electrode substrate related to the fifth embodiment.

FIG. 28A and FIG. 28B is a graph which exemplifies the case where the correction function is changed for each region of a through-hole electrode substrate formed with an opening. In FIG. 28A, the vertical axis shows the amount of correction and the horizontal axis shows the range from the center to the periphery of the through-hole electrode substrate as the formation position of the opening. In this case, the amount of correction of the formation position of the opening is set at [no correction] in region A, [fixed value correction] in region B, [linear correction] in region C, [quadratic curve correction] in region D and [random correction] in region E shown in the diagram within the range from the center to the periphery of the through-hole electrode substrate. In a linear correction, the formation position of the opening is corrected by a correction amount based on the linear function described above. In the fixed value correction, the formation position of the opening is corrected by a fixed correction amount. In the quadratic curve correction, the formation position of the opening is corrected by a correction amount based on the quadratic function described above. In the random correction, the formation position of the opening is corrected by measuring the coordinates (Xr, Xr) for correcting the position of each opening formed in the resin layer based on the difference between the design value d of the position of each opening shown in FIG. 26 and the distance r to the actual formation position.

In FIG. 28B the vertical axis shows the correction amount and the horizontal axis shows the range from the center to the periphery of the through-hole electrode substrate as the formation position of the opening. In this case, the amount of correction of the formation position of the opening is set at

[no correction] in region A, [fixed value correction] in region B and region B', [linear correction] in region C and region C', [quadratic curve correction] in region D and region D' and [random correction] in region E and region E' shown in the diagram within the range from the center to the periphery of the through-hole electrode substrate with the center being between region B' and region C' in the diagram. Furthermore, [fixed value correction] means correcting the formation position of each opening by a fixed correction amount regardless of the formation position of a through-hole electrode substrate within the surface of a silicon substrate.

As described above, by changing the correction function for correcting the formation position of an opening for each region as shown in FIG. 28A and FIG. 28B it is possible to appropriately correct the formation position of each opening formed in a resin layer for each region. As a result, it is possible to reduce the production of defects such as [step out] or [disconnection] in an electrode pad and improve yield when forming a plurality of chip shaped through-hole electrode substrates 200 in a wafer. For example, in dry etching used when manufacturing a through-hole electrode substrate, in the case where the distribution of ion sheath is different in the surface of a silicon substrate, it is feared that the amount of tilt may change in a through-hole in each formation position of the through-hole electrode substrate formed in the silicon substrate. In this case, for example, by applying [fixed value correction] or [linear correction] described above to a region in which tilt is small and applying [quadratic curve correction] or [random correction] to a region in which tilt is large in the surface of a silicon substrate, it is possible to appropriately correct the formation position of each opening formed in a resin layer in the surface of the silicon substrate.

Figure 29:
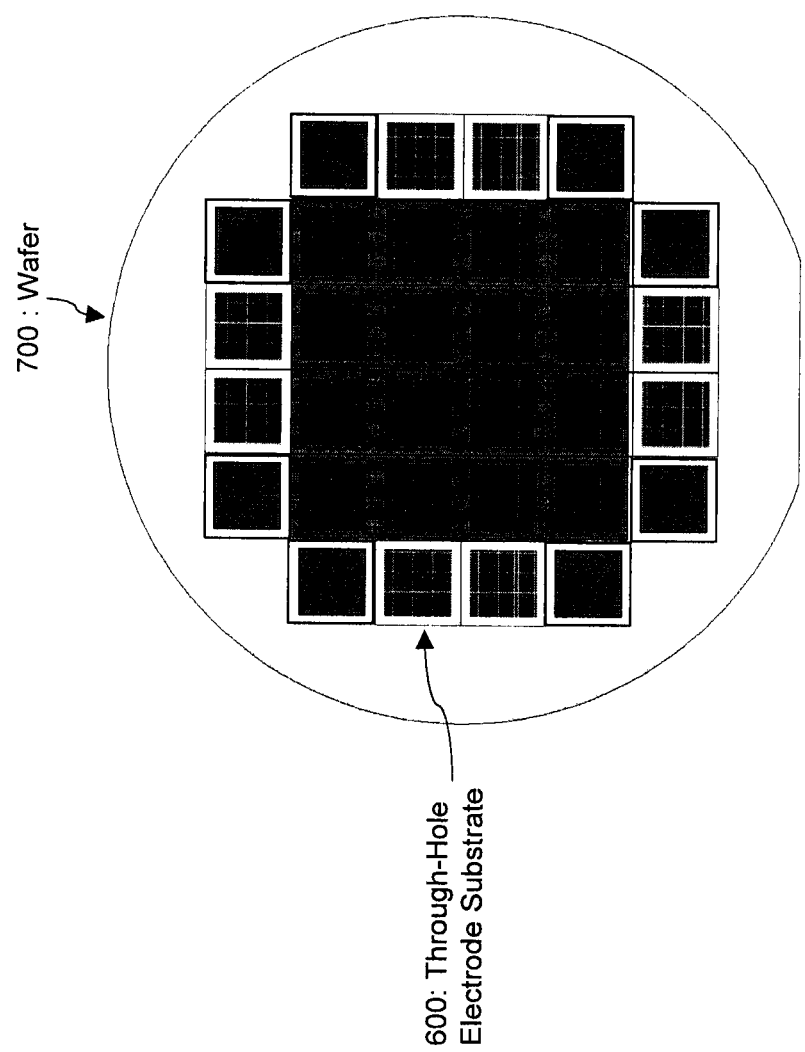
FIG. 29 is a diagram which shows an example in which a plurality of chip shaped through-hole electrode substrates are formed within a wafer related to the fifth embodiment.

Furthermore, an example is shown in which a correction function is changed for each region within one through-hole electrode substrate in the fifth embodiment described above, however, the present invention is not limited to this. For example, [no correction], [fixed value correction], [linear correction] and [random correction] may be applied to each formation region of this plurality of through-hole electrode substrates by understanding the tilt tendency produced in a through-hole within the through-hole electrode substrate for each formation region of a plurality of through-hole electrode substrates imposed to the surface within the wafer. In this case, for example, it is possible to form more chip shaped through-hole electrode substrates 600 in the wafer 700 shown in FIG. 29 than the plurality of chip shaped through-hole electrode substrates 100 formed in the surface of the wafer 300 shown in FIG. 9, and cut out the 16 chips formed in the center part as good products. As a result, it is possible to improve the yield of the through-hole electrode substrate and reduce manufacturing cost.

(Sixth Embodiment)

An example of an electronic circuit board mounted with a sensor device which uses the through-hole electrode substrates 100, 200, 600 shown in the first, second and fourth embodiments as an interposer is explained in the sixth embodiment.

Figure 30:
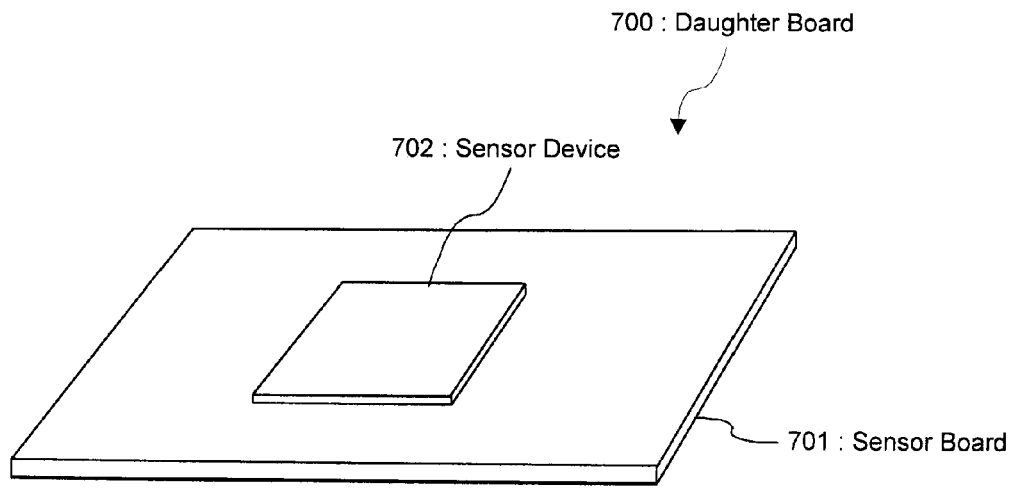
FIG. 30 is a perspective view diagram which shows a formation example of a daughter board which uses a though hole electrode substrate related to the sixth embodiment.

FIG. 30 is a perspective view diagram which shows a structural example of a daughter board mounted with a sensor device. In FIG. 30, the daughter board 700 is mounted on a sensor board 701 and is mounted with a sensor device 702 which is formed using the through-hole electrode substrates 100, 200, 600 shown in the first, second and fourth embodiments as an interposer. Furthermore, the sensor device 702 may be formed by a chip board 503 comprised for example from a lower layer board 503a, an interposer 503b and an upper layer board 503c as is shown in FIG. 21 in the third embodiment.

Figure 31:
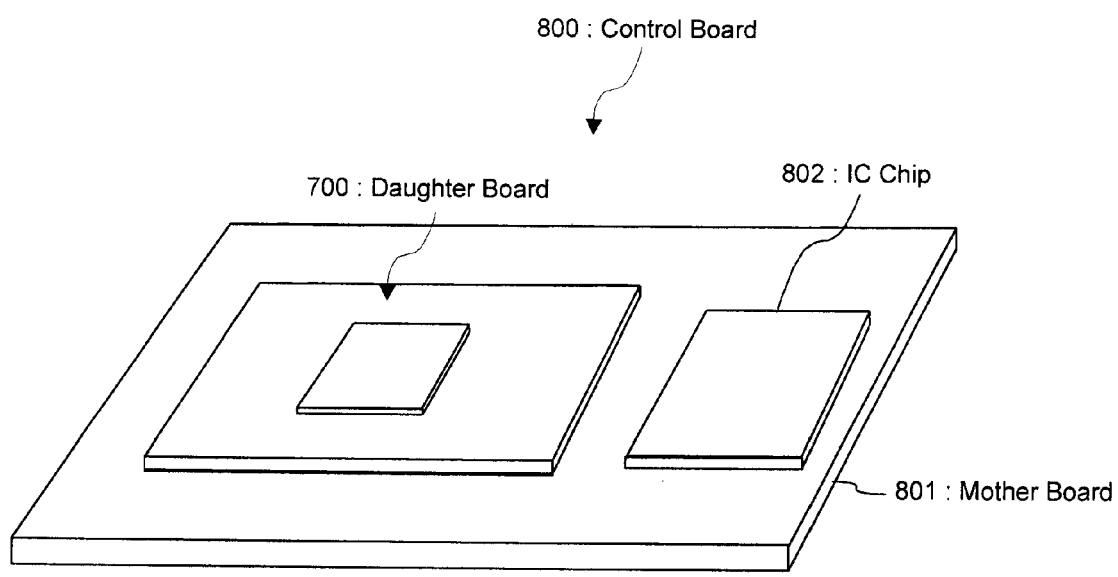
FIG. 31 is a perspective view diagram which shows a formation example of a control board mounted with the daughter board in FIG. 30.

FIG. 31 is a perspective view diagram which shows a structural example of a control board 800 mounted with the daughter board 700 shown in FIG. 30. In FIG. 31 the control board 800 is mounted on a motherboard 801 and is mounted with an IC chip 802 and daughter board 700.

As described above, by forming a sensor device 702 which is formed using the through-hole electrode substrates 100, 200 and 600 as an interposer, and forming a daughter board 700 mounted with this sensor device 702, it is possible to mount the IC chip 802 at high density on the motherboard 801. Therefore, it is possible to contribute to the miniaturization of an electrical device by applying this type of control board 800 to the electrical device.

Figure 32:
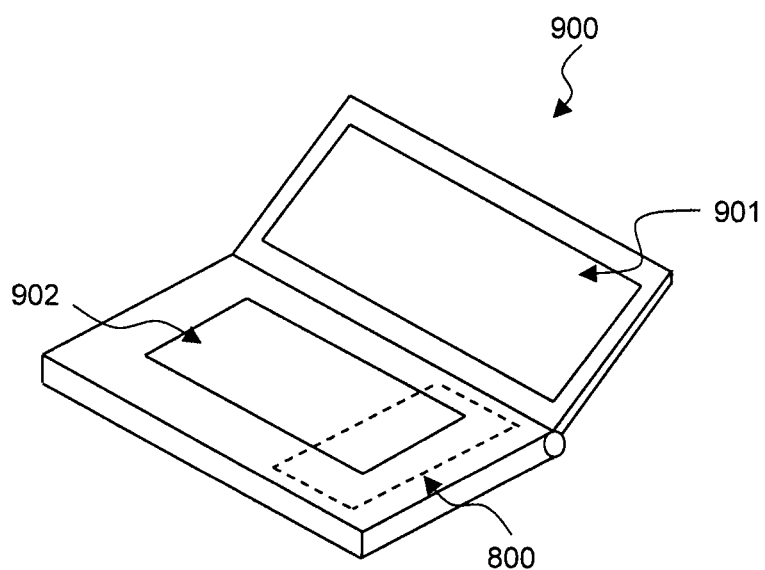
FIG. 32 is a perspective view diagram which shows a formation example of an electronic device mounted with the control board in FIG. 31.

Here, a personal digital assistant 900 is shown in FIG. 32 as an electrical device mounted with the control board 800. FIG. 32 is a perspective view diagram which shows a structural example of the personal digital assistant 900. In FIG. 32 the personal digital assistant 900 is formed by a display part 901 and a keyboard part 902. The control board 800 is mounted within the keyboard part 902. Various programs are stored within the personal digital assistant 900 and includes a function for executing communication processes and data processes by each program. In this personal digital assistant 900, by using dynamic quantity (for example, acceleration) which is detected by the sensor device 702 on the control board 800 in an application program, it is possible, for example, to include a function which power switch off the terminal when a drop in acceleration is detected.

As described above, by mounting the control board 800 in a personal digital assistant, it is possible to realize new functions and improve the usefulness and reliability of the personal digital assistant.

What is claimed is:

1. A method of manufacturing a through-hole electrode substrate comprising:
   forming a plurality of through-holes in a substrate:
   forming a plurality of through-hole electrodes by filling a conductive material into the plurality of through-holes;
   forming a first insulation layer on one surface of the substrate;
   forming a plurality of first openings which expose the plurality of through-hole electrodes corresponding to each of the plurality of through-hole electrodes, on the first insulation layer; and
   correcting a position of the plurality of first openings based on a difference between a measured distance of an open position of a leaning through-hole among the plurality of through-holes and a design distance value of the open position of the leaning through-hole among the plurality of through-holes with respect to a center position of the substrate.

2. The method of manufacturing a through-hole electrode substrate according to claim 1, further comprising:
   forming a second insulation layer on the other surface of the substrate;
   forming a plurality of second openings which expose the plurality of through-hole electrodes, on the second insulation later; and
   correcting a position of the plurality of second openings based on a difference between a measured distance of an open position of a leaning through-hole among the plurality of through-holes and a design distance value of the open position of the leaning through-hole among the plurality of through-holes with respect to a center position of the substrate.

3. The method of manufacturing a through-hole electrode substrate according to claim 2, wherein a position of the plurality of second openings is corrected using a correction function which expresses a difference between a measured distance of an open position of the leaning through-hole and a design distance value of the open position of the leaning through-hole among the plurality of through-holes with respect to a center position of the substrate.

4. The method of manufacturing a through-hole electrode substrate according to claim 1, further comprising:
   forming a third insulation layer in each interior wall of the plurality of through-holes, and forming a conductive material on the third insulation layer.

5. The method of manufacturing a through-hole electrode substrate according to claim 1, wherein either one or all of the first insulation layer, the second insulation layer and the third insulation layer are formed using an insulation resin.

6. The method of manufacturing a through-hole electrode substrate according to claim 1, wherein a position of the plurality of first openings is corrected using a correction function which expresses a difference between a measured distance of an open position of the leaning through-hole and a design distance value of the open position of the leaning through-hole among the plurality of through-holes with respect to a center position of the substrate.

7. The method of manufacturing a through-hole electrode substrate according to claim 6, wherein the one surface or the other surface of the substrate is divided into a plurality of regions from a center position heading to a periphery, and the correction function for correcting a position of the plurality of first openings or a position of the plurality of second openings is made different for each of the plurality of regions.

8. The method of manufacturing a through-hole electrode substrate according to claim 6, wherein the correction function uses a fixed value correction, a linear correction, a quadratic curve correction or a random correction.

\* \* \* \* \*